(12) United States Patent
Lee et al.

(10) Patent No.: US 9,704,842 B2
(45) Date of Patent: Jul. 11, 2017

(54) INTERPOSER, MANUFACTURING METHOD THEREOF, SEMICONDUCTOR PACKAGE USING THE SAME, AND METHOD FOR FABRICATING THE SEMICONDUCTOR PACKAGE

(71) Applicant: Amkor Technology, Inc., Chandler, AZ (US)

(72) Inventors: DongHoon Lee, Seoul (KR); DoHyung Kim, Gyeonggi-do (KR); JungSoo Park, Seoul (KR); SeungChul Han, Gyeonggi-do (KR); JooHyun Kim, Chungcheongnam-do (KR); David Jon Hiner, Chandler, AZ (US); Ronald Patrick Huemoeller, Gilbert, AZ (US); Michael G. Kelly, Queen Creek, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/532,532

(22) Filed: Nov. 4, 2014

(65) Prior Publication Data

US 2015/0125993 A1  May 7, 2015

(30) Foreign Application Priority Data

Nov. 4, 2013 (KR) ........................ 10-2013-0132666

(51) Int. Cl.
*H01L 21/4763* (2006.01)
*H01L 23/12* (2006.01)
(Continued)

(52) U.S. Cl.
CPC ............ *H01L 25/50* (2013.01); *H01L 21/486* (2013.01); *H01L 21/4857* (2013.01);
(Continued)

(58) Field of Classification Search
CPC ..... H01L 25/50; H01L 21/56; H01L 21/4857; H01L 21/6835; H01L 23/5226;
(Continued)

(56) References Cited

U.S. PATENT DOCUMENTS 3,462,349 A  8/1969  Gorgenyi
3,868,724 A  2/1975  Perrino
(Continued)

FOREIGN PATENT DOCUMENTS

JP  05-109975  4/1993
JP  05-136323  6/1993
(Continued)

OTHER PUBLICATIONS

CAD_CIM Requirements Article IMAPS, Sep./Oct. 1994.
(Continued)

*Primary Examiner* — Alonzo Chambliss
(74) *Attorney, Agent, or Firm* — McAndrews, Held & Malloy, Ltd.

(57) ABSTRACT

An interposer having a multilayered conductive pattern portion that is constructed by repeating the direct printing on a carrier of one or more conductive pattern layers and application of one or more insulating layers between the printed conductive pattern layers is described. Also, a method for manufacturing the interposer, a semiconductor package using the interposer, and a method for fabricating the semiconductor package are described.

12 Claims, 16 Drawing Sheets

(51) Int. Cl.
*H01L 25/00* (2006.01)
*H01L 21/683* (2006.01)
*H01L 23/498* (2006.01)
*H01L 21/48* (2006.01)
*H01L 23/31* (2006.01)
*H01L 21/56* (2006.01)

(52) U.S. Cl.
CPC .... *H01L 21/6835* (2013.01); *H01L 23/49822* (2013.01); *H01L 23/49827* (2013.01); *H01L 21/568* (2013.01); *H01L 23/3128* (2013.01); *H01L 2221/68318* (2013.01); *H01L 2221/68345* (2013.01); *H01L 2221/68381* (2013.01); *H01L 2224/16225* (2013.01); *H01L 2224/73204* (2013.01); *H01L 2924/15192* (2013.01); *H01L 2924/15311* (2013.01); *H01L 2924/16152* (2013.01); *H01L 2924/181* (2013.01)

(58) Field of Classification Search
CPC ............... H01L 23/28; H01L 23/49822; H01L 25/214857; H01L 21/486; H01L 23/49827
See application file for complete search history.

(56) References Cited

U.S. PATENT DOCUMENTS

| | | |
|---|---|---|
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | Maciver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Ojennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,193 A | 11/1998 | Eichelberger |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,051,888 A | 4/2000 | Dahl |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,137,062 A | 10/2000 | Zimmerman |
| 6,157,080 A | 12/2000 | Tamaki et al. |
| 6,159,767 A | 12/2000 | Eichelberger |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Pan chou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,294,408 B1 | 9/2001 | Edwards et al. |
| 6,307,161 B1 | 10/2001 | Grube et al. |
| 6,316,285 B1 | 11/2001 | Jiang et al. |
| 6,329,609 B1 | 12/2001 | Kaja et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,486,005 B1 | 11/2002 | Kim |
| 6,486,554 B2 | 11/2002 | Johnson |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,573,598 B2 | 6/2003 | Ohuchi et al. |
| 6,586,682 B2 | 7/2003 | Strandberg |
| 6,608,382 B2 | 8/2003 | Liu et al. |
| 6,608,757 B1 | 8/2003 | Bhatt et al. |

(56) References Cited

U.S. PATENT DOCUMENTS

| | | |
|---|---|---|
| 6,660,559 B1 | 12/2003 | Huemoeller et al. |
| 6,715,204 B1 | 4/2004 | Tsukada et al. |
| 6,727,576 B2 | 4/2004 | Hedler |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,765,287 B1 | 7/2004 | Lin |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leale et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leale et al. |
| 6,931,726 B2 | 8/2005 | Boyko et al. |
| 6,943,436 B2 | 9/2005 | Radu et al. |
| 6,953,995 B2 | 10/2005 | Farnworth et al. |
| 6,967,403 B2 | 11/2005 | Chuang et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,112,882 B2 | 9/2006 | Lee |
| 7,119,432 B2 | 10/2006 | Desai et al. |
| 7,125,744 B2 | 10/2006 | Takehara et al. |
| 7,185,426 B1 | 3/2007 | Hiner et al. |
| 7,192,807 B1 | 3/2007 | Huemoeller et al. |
| 7,196,408 B2 | 3/2007 | Yang et al. |
| 7,198,980 B2 | 4/2007 | Jiang et al. |
| 7,202,107 B2 | 4/2007 | Fuergut et al. |
| 7,215,026 B2 | 5/2007 | Park et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,262,082 B1 | 8/2007 | Lin et al. |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,675,131 B2 | 3/2010 | Derderian |
| 7,750,454 B2 | 7/2010 | Carson et al. |
| 7,777,351 B1 | 8/2010 | Berry et al. |
| 7,781,883 B2 | 8/2010 | Sri-Jayantha et al. |
| 7,825,520 B1 | 11/2010 | Longo et al. |
| 7,902,660 B1 | 3/2011 | Lee et al. |
| 7,928,562 B2 | 4/2011 | Arvelo et al. |
| 7,960,827 B1 | 6/2011 | Miller et al. |
| 7,982,298 B1 | 7/2011 | Kang et al. |
| 7,993,983 B1 | 8/2011 | Lin |
| 8,008,770 B2 | 8/2011 | Lin et al. |
| 8,035,123 B2 | 10/2011 | Yan et al. |
| 8,058,726 B1 | 11/2011 | Jin et al. |
| 8,067,268 B2 | 11/2011 | Carson et al. |
| 8,069,560 B2 * | 12/2011 | Mori et al. ...................... 29/852 |
| 8,106,500 B2 | 1/2012 | Chow |
| 8,222,538 B1 | 7/2012 | Yoshida et al. |
| 8,258,015 B2 | 9/2012 | Chow et al. |
| 8,258,633 B2 * | 9/2012 | Sezi et al. ...................... 257/782 |
| 8,269,348 B2 | 9/2012 | Fazelpour |
| 8,288,201 B2 | 10/2012 | Pagaila |
| 8,341,835 B1 | 1/2013 | Huemoeller et al. |
| 8,471,154 B1 | 6/2013 | Yoshida et al. |
| 8,471,376 B1 | 6/2013 | Liou et al. |
| 8,471,394 B2 | 6/2013 | Jang et al. |
| 8,508,954 B2 | 8/2013 | Kwon et al. |
| 8,536,462 B1 | 9/2013 | Darveaux et al. |
| 8,552,556 B1 | 10/2013 | Kim et al. |
| 8,610,292 B2 * | 12/2013 | Chino ................... H01L 21/561 |
| | | 257/730 |
| 8,624,374 B2 | 1/2014 | Ding et al. |
| 8,643,163 B2 | 2/2014 | Shim et al. |
| 8,759,147 B2 | 6/2014 | Choi et al. |
| 8,773,866 B2 | 7/2014 | Jin et al. |
| 8,829,678 B2 | 9/2014 | Lee et al. |
| 8,946,883 B2 | 2/2015 | Kim et al. |
| 8,981,550 B2 | 3/2015 | Park et al. |
| 9,012,789 B1 | 4/2015 | Yoshida et al. |
| 2002/0011657 A1 | 1/2002 | Saito |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0135057 A1 | 9/2002 | Kurita |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0036183 A1 | 2/2004 | Im et al. |
| 2004/0063246 A1 | 4/2004 | Karnezos |
| 2004/0145044 A1 | 7/2004 | Sugaya et al. |
| 2004/0159462 A1 | 8/2004 | Sugaya et al. |
| 2004/0165362 A1 | 8/2004 | Farnworth |
| 2004/0262774 A1 | 12/2004 | Kang et al. |
| 2005/0056928 A1 | 3/2005 | Kwon et al. |
| 2005/0062154 A1 | 3/2005 | Duchesne et al. |
| 2005/0133928 A1 | 6/2005 | Howard et al. |
| 2005/0133932 A1 | 6/2005 | Pohl et al. |
| 2005/0134507 A1 | 6/2005 | Dishongh et al. |
| 2005/0139985 A1 | 6/2005 | Takahashi |
| 2005/0242425 A1 | 11/2005 | Leal et al. |
| 2006/0192301 A1 | 8/2006 | Leal et al. |
| 2006/0208351 A1 | 9/2006 | Poo et al. |
| 2006/0231958 A1 | 10/2006 | Yang |
| 2006/0258044 A1 | 11/2006 | Meyer et al. |
| 2007/0059866 A1 | 3/2007 | Yang et al. |
| 2007/0064395 A1 | 3/2007 | Chen et al. |
| 2007/0080757 A1 | 4/2007 | Yahata et al. |
| 2007/0132104 A1 | 6/2007 | Farnworth et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0050566 A1 * | 2/2008 | Shishida ............ H01L 21/02126 |
| | | 428/213 |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0182363 A1 | 7/2008 | Amrine et al. |
| 2008/0230887 A1 | 9/2008 | Sun et al. |
| 2008/0241997 A1 * | 10/2008 | Sunohara et al. ............. 438/109 |
| 2008/0246133 A1 | 10/2008 | Derderian |
| 2008/0290492 A1 | 11/2008 | Chung et al. |
| 2008/0290496 A1 | 11/2008 | Park |
| 2009/0051025 A1 | 2/2009 | Yang et al. |
| 2009/0183910 A1 * | 7/2009 | Sunohara ................. H01L 23/13 |
| | | 174/266 |
| 2009/0243073 A1 | 10/2009 | Carson et al. |
| 2009/0289343 A1 | 11/2009 | Chiu et al. |
| 2009/0309206 A1 | 12/2009 | Kim et al. |
| 2010/0007002 A1 | 1/2010 | Pendse |
| 2010/0007032 A1 | 1/2010 | Gallegos |
| 2010/0020503 A1 | 1/2010 | Beaumier et al. |
| 2010/0130000 A1 | 5/2010 | Sutou et al. |
| 2010/0140779 A1 | 6/2010 | Lin et al. |

(56) References Cited

U.S. PATENT DOCUMENTS

| | | |
|---|---|---|
| 2010/0167451 A1 | 7/2010 | Derderian |
| 2010/0181665 A1 | 7/2010 | Casey et al. |
| 2010/0208432 A1 | 8/2010 | Bhagwagar et al. |
| 2011/0062602 A1 | 3/2011 | Ahn et al. |
| 2011/0068427 A1 | 3/2011 | Paek et al. |
| 2011/0068478 A1 | 3/2011 | Pagaila et al. |
| 2011/0084382 A1 | 4/2011 | Chen et al. |
| 2011/0089551 A1* | 4/2011 | Ishihara et al. .......... 257/685 |
| 2011/0204505 A1 | 8/2011 | Pagaila et al. |
| 2011/0227223 A1 | 9/2011 | Wu et al. |
| 2011/0233782 A1 | 9/2011 | Chang et al. |
| 2012/0061855 A1 | 3/2012 | Do et al. |
| 2012/0069683 A1 | 3/2012 | Kamata et al. |
| 2012/0094443 A1 | 4/2012 | Pratt et al. |
| 2012/0153453 A1 | 6/2012 | Ankireddi et al. |
| 2012/0168917 A1 | 7/2012 | Yim et al. |
| 2012/0178218 A1 | 7/2012 | Bauer et al. |
| 2012/0326307 A1 | 12/2012 | Jeong et al. |
| 2012/0326324 A1 | 12/2012 | Lee et al. |
| 2013/0017643 A1 | 1/2013 | Lin et al. |
| 2013/0037942 A1 | 2/2013 | Hwang et al. |
| 2013/0040427 A1 | 2/2013 | Hu et al. |
| 2013/0052775 A1 | 2/2013 | Kim et al. |
| 2013/0062786 A1 | 3/2013 | Leung et al. |
| 2013/0075924 A1 | 3/2013 | Lin et al. |
| 2013/0078765 A1 | 3/2013 | Lin et al. |
| 2013/0078915 A1 | 3/2013 | Zhao et al. |
| 2013/0087914 A1* | 4/2013 | Yang et al. .......... 257/738 |
| 2013/0134559 A1 | 5/2013 | Lin et al. |
| 2013/0214402 A1 | 8/2013 | Park et al. |
| 2013/0241039 A1 | 9/2013 | Choi et al. |
| 2013/0309814 A1 | 11/2013 | Too et al. |
| 2013/0320517 A1 | 12/2013 | Shirley |
| 2013/0328192 A1 | 12/2013 | Lee et al. |
| 2014/0048906 A1 | 2/2014 | Shim et al. |
| 2014/0061893 A1 | 3/2014 | Saeidi et al. |
| 2014/0077366 A1 | 3/2014 | Kim et al. |
| 2014/0124949 A1 | 5/2014 | Paek |
| 2014/0131856 A1 | 5/2014 | Do |
| 2014/0138817 A1 | 5/2014 | Paek et al. |
| 2014/0210109 A1 | 7/2014 | Tanaka et al. |
| 2015/0021791 A1 | 1/2015 | Park |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |
| JP | 2001-118947 | 10/1999 |
| JP | 2005-333052 | 12/2005 |
| JP | 2006-073622 | 3/2006 |
| JP | 2007-043090 | 2/2007 |
| KR | 1020060050579 | 5/2006 |
| KR | 1020120053332 | 5/2012 |
| KR | 1020130092208 | 8/2013 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package", 58.sup.th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Nicholls et al., "Methods and Structures for Increasing the Allowable Die Size in TMV Packages," U.S. Appl. No. 13/398,646, filed Feb. 16, 2012.

Nicholls et al., "Methods and Structures for Increasing the Allowable Die Size in TMV Packages," U.S. Appl. No. 61/444,306, filed Feb. 18, 2011.

Huemoeller et al., "Build Up Motherboard Fabrication Method and Structure", U.S. Appl. No. 11/824,395, filed Jun. 29, 2007.

Hiner et al., "Printed Wiring Motherboard Having Bonded Interconnect Redistribution Mesa", U.S. Appl. No. 10/992,371, filed Nov. 18, 2004.

Int'l Search Report and Written Opinion for PCT/US13/69057 dated Apr. 4, 2014 (10 pages).

Office Action corresponding to Korean Patent Application No. 10-2013-0132666, 10 pages, Mar. 4, 2015.

\* cited by examiner

INTERPOSER, MANUFACTURING METHOD THEREOF, SEMICONDUCTOR PACKAGE USING THE SAME, AND METHOD FOR FABRICATING THE SEMICONDUCTOR PACKAGE

CROSS-REFERENCE TO RELATED APPLICATIONS/INCORPORATION BY REFERENCE

The present application makes reference to, claims priority to, and claims the benefit of Korean Patent Application No. 10-2013-0132666, filed on Nov. 4, 2013, the contents of which are hereby incorporated herein by reference, in their entirety.

FIELD

The present disclosure relates to an interposer for use in a semiconductor package. More particularly, the present disclosure relates to an interposer having a multilayered conductive pattern portion that is constructed by repeating the direct printing on a carrier of one or more conductive pattern layers and application of one or more insulating layers between the printed conductive pattern layers. Also, the present disclosure is concerned with a method for manufacturing the interposer, a semiconductor package using the interposer, and a method for fabricating the semiconductor package.

BACKGROUND

A development trend of electronic devices toward increased intricacy and adaptability, including: weight reduction, miniaturization, increased speed, multi-functionalization, and high performance is possible based upon the high reliability of semiconductor elements mounted within the electronic devices. For this, various types of packages such as a die scale package, at a wafer level; and a die stack-type package, in which various die are attached to an interposer at once to mount the die onto a Printed Circuit Board (PCB), are being developed. Particularly, as more conductive pads of a printed circuit board (PCB), and more bonding pads of a semiconductor die are needed for signal input/output, they are formed more densely.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

An interposer device, a method of manufacturing an interposer device, and a semiconductor package manufactured using an interposer device, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

The present disclosure relates to an interposer for use in a semiconductor package. More particularly, the present disclosure relates to an interposer having a multilayered conductive pattern portion that is constructed by repeating the direct printing on a carrier of one or more conductive pattern layers and application of one or more insulating layers between the printed conductive pattern layers. Also, the present disclosure is concerned with a method for manufacturing the interposer, a semiconductor package using the interposer, and a method for fabricating the semiconductor package.

Hereinafter, a detailed description will be given of exemplary embodiments of the present disclosure with reference to the accompanying drawings.

As utilized herein, the terms "exemplary" or "example" mean serving as a non-limiting example, instance, or illustration. As utilized herein, the term "e.g." introduces a list of one or more non-limiting examples, instances, or illustrations.

Accordingly, deviating from a typical wire bonding method in which the PCB and the semiconductor die are connected to each other using a conductive wire to exchange electrical signals, die stack-type packages in which the PCB and the semiconductor die are conductively stacked by means of an interposer are being developed.

Hereinafter, the structure of a semiconductor package using an interposer according to the present disclosure will be described.

Figure 1:
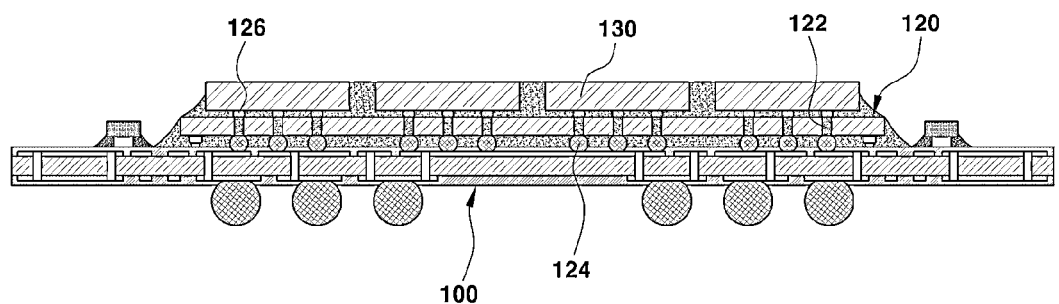
FIG. 1 is a cross-sectional view of a portion of an example semiconductor package in which a reference numeral denotes a printed circuit board (PCB), and a reference numeral denotes a lower die used as an interposer formed of, for example, silicon, which is conductively attached to the PCB.

FIG. 1 is a cross-sectional view of a portion of an example semiconductor package in which the reference numeral 100 denotes a printed circuit board (PCB), and the reference numeral 120 denotes a lower die used as an interposer formed of, for example, silicon, which is conductively attached to the PCB 100.

The interposer 120 serves to transmit electrical signals between an upper die 130 and the PCB 100 by means of a plurality of through-silicon vias 122, while blocking a substantial contact region between one or more upper die 130 and the PCB 100. The interposer 120 may reduce or eliminate undesirable side-effects that may occur due to differences in the coefficients of thermal expansion of the upper die 130 and the PCB 100. The through-silicon vias 122 may be fabricated by forming via holes in the interposer 120 using, for example, a laser process and then filling the via holes with a conductive filler such as, for example, a solder material.

After being attached to or formed on the undersurface of the through-silicon vias 122, a first conductive connector such as, by way of example and not limitation, one or more balls or bumps 124 made of, for example, a solder material, may be conductively fused to one or more conductive pads of the PCB 100, thereby mounting the interposer 120 onto the PCB 100.

Next, a plurality of upper die 130 each having a plurality of second conductive connectors 126 attached, may be attached to a bonding pad of the interposer 120. In this manner, the second conductive connectors 126 of each upper die 130 may be fused to the top surface of the through-silicon vias 122, thereby attaching each of the upper die 130 to the interposer 120.

However, the use of interposers as described above involves the formation of one or more through-silicon vias using, for example, a laser process, which may increase production cost. In addition, the material used for the interposer has a certain thickness and weight, which increases the thickness and weight of the semiconductor package in which it is used, which is undesirable in view of the current tendencies towards weight-reduction, slimming, shortening, and miniaturization of semiconductor packages.

Figure 2:
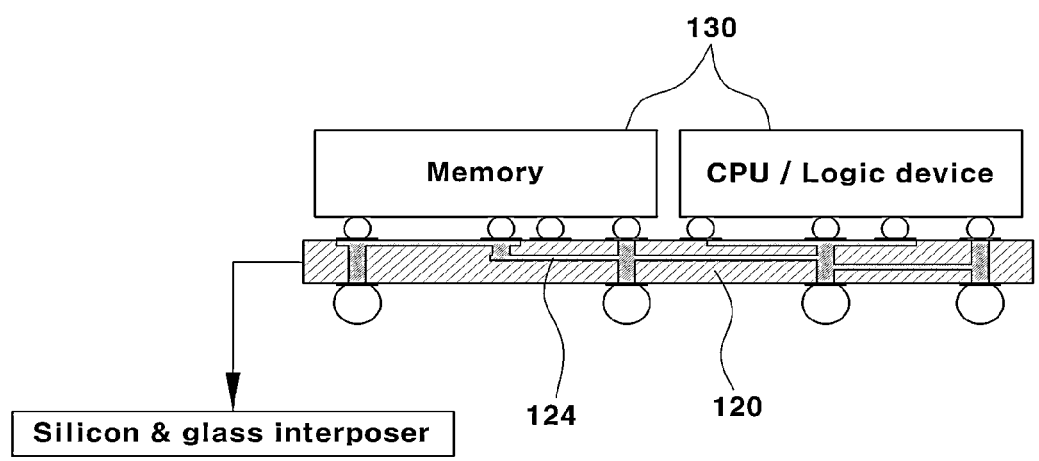
FIG. 2 is a cross-sectional view of a portion of a semiconductor package including an interposer.

FIG. 2 is a cross-sectional view of a portion of a semiconductor package including an interposer 120. As shown in the example of FIG. 2, the interposer 120 to which the two upper die 130 are conductively attached may, for example, be formed of a glass or a silicon material, and may have a structure in which a plurality of conductive layers 124 are formed using, for example, a photolithographic process, instead of through-silicon vias formed by, for example, a laser process, as discussed above with respect to the example of FIG. 1.

However, a number of processing steps may be used in fabricating the interposer 120 of FIG. 2 including, for example, a process of attaching a photoresist, and a patterning and exposure process for removing a certain portion of the photoresist, which may cause a reduction in productivity and an increase in the cost of manufacturing the semiconductor package of which the interposer 120 of FIG. 2 is a component. In addition, the thickness and/or weight of the silicon or glass materials for the interposer 120 may cause the overall thickness and/or weight of the semiconductor package to increase, making weight-reduction, thinning, shortening, and miniaturization of the semiconductor package difficult.

The example structures discussed above involve a number of processes including attaching a photoresist, and patterning and exposing to selectively remove the photoresist, thus causing a decrease in productivity and an increase in production cost. In addition, the thickness of silicon or glass for the interposer may cause the overall thickness and weight of the semiconductor package to increase, making it more difficult to achieve gains in the tendency toward weight-reduction, slimming, shortening and miniaturization of semiconductor packages.

In contrast, an interposer according to the following discussion has a structure in which a plurality of conductive pattern layers are inter-conductively stacked in a direct printing manner, with insulating layers positioned between the stacked conductive pattern layers. Compared to a conventional interposer, the interposer of the present disclosure is lighter, slimmer, shorter, and smaller, and thus may be useful for the fabrication of a semiconductor package in line with current trends.

FIGS. 3A-3F show a series of cross-sectional views illustrating steps in a process of manufacturing an interposer that may be used in a semiconductor package, according to a first exemplary embodiment of the present disclosure. In FIGS. 3A-3F, the reference numeral 11 denotes a carrier that is a portion of a support member useful for manufacturing the interposer of the present disclosure. The carrier 11 may be formed of, by way of example and not limitation, a silicon material or a glass material having a certain area. After completing its role as a support member the fabrication of the interposer, the carrier 11 may then be separated from the interposer, for reuse, together with a release layer 12 and a passivation layer 13, in the process for manufacturing a subsequent semiconductor package, as will be described in greater detail below.

Figure 3A:
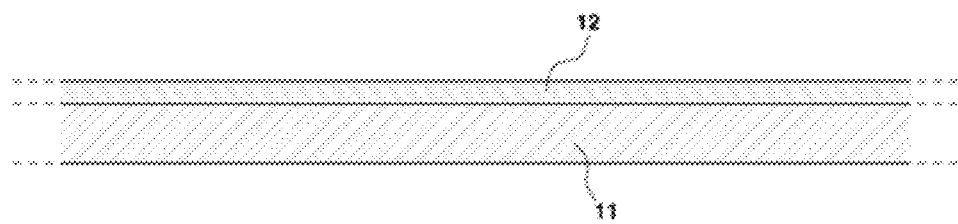
FIGS. 3A-3F show a series of cross-sectional views illustrating steps in a process of manufacturing an interposer that may be used in a semiconductor package, according to a first exemplary embodiment of the present disclosure.

FIG. 3A is an illustration of an exemplary first step of the process of manufacturing an interposer, in accordance with an embodiment of the present disclosure. As shown in FIG. 3A, a release layer 12 may be applied directly onto the surface of the carrier 11, in accordance with an embodiment of the present disclosure. In a representative embodiment of the present disclosure, both inorganic and organic materials may be used for a structural element such as the release layer 12, and such materials may be deposited using, by way of example and not limitation, spin-coating, chemical vapor deposition (CVD), physical vapor deposition (PVD), or any other suitable technique. In some exemplary embodiments, the release layer may be, by way of example and not limitation, an organic material such as polyimide (PI) or polybenzoxazole (PBO), and may include other suitable proprietary or non-proprietary materials.

Figure 3B:
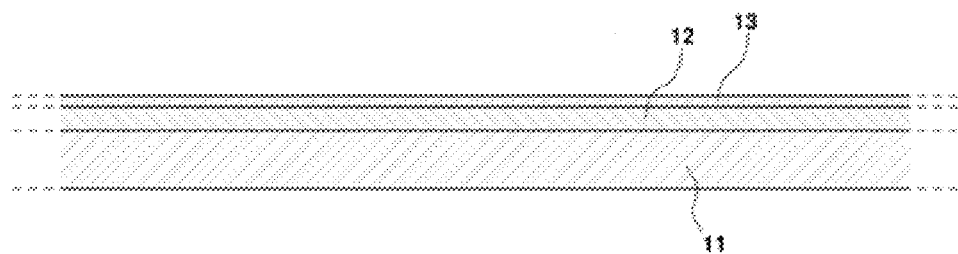

FIG. 3B illustrates an exemplary second step of the process of manufacturing an interposer, in accordance with an embodiment of the present disclosure. In FIG. 3B, a blanket of a passivation layer 13 may be deposited at a certain thickness directly onto the release layer 12. The passivation layer 13 may be used to protect a conductive pattern layer of the interposer from an external environment. A structural element such as the passivation layer 13 may comprise, by way of example and not limitation, a material such as silicon nitride (referred to herein as SiN or $Si_3N_4$) or tetraethyl orthosilicate (TEOS) applied using Chemical Vapor Deposition, an organic material such as polyimide (PI) or polybenzoxazole (PBO) applied using a spin-coating method with curing, or any other suitable substance.

Figure 3C:
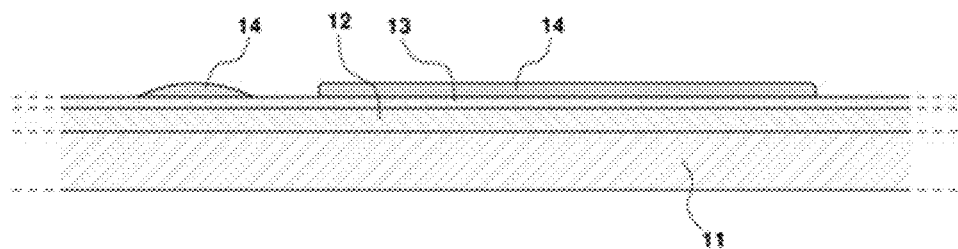

FIG. 3C is an illustration of an exemplary third step of the process of manufacturing an interposer, in accordance with an embodiment of the present disclosure. In FIG. 3C, the conductive pattern layer 14 may be directly printed onto the passivation layer 13 in a pattern conforming to a circuit design. In a representative embodiment of the present disclosure, the direct printing of the conductive pattern layer 14 may be performed using, by way of example and not limitation, a nanoimprint lithography or an inkjet printing technology.

The term "nanoimprint lithography" may be used herein to refer to a method of fabricating nanometer scale patterns without using complex photolithography. Instead, a stamp or tool on which a desired pattern has been formed is coated with, by way of example and not limitation, a liquid such as an ultraviolet (UV) sensitive liquid or "ink" that is a conductive solid when set or cured by exposure to UV light. The pattern formed on the stamp or tool may be representative of one or more electrical circuit paths. The UV-sensitive ink on the pattern formed on the stamp or tool is then transferred to or imprinted upon a surface of, by way of example and not limitation, a silicon wafer, die, substrate, or other target. Following the imprinting or transfer of the UV-sensitive conductive ink from the stamp or tool onto the wafer, die, substrate, or other target, the imprinted surface of the wafer, die, substrate, or other target may then be exposed to UV light, to cure the UV-sensitive ink to form the desired conductive pattern.

The term "inkjet printing technology" may be used herein to refer to a technique of forming a pattern by spraying a liquid or "ink" from a nozzle having a small aperture, to print the desired pattern onto a wafer or sample. Although the example of ink-jet printing is presented as one direct-printing approach, other suitable techniques include, by way of example and not limitation, screen printing and gravure printing. Example liquids or "inks" that may be used may include, by way of example and not limitation, liquid materials based upon copper, silver, or any other suitable metallic material, and each suitable formulation of the liquid or "ink" may have a particular process of curing or setting the liquid to form the conductive paths. In some representative embodiments in which UV-sensitive liquid or "ink" is used, following the printing of the UV-sensitive liquid or "ink" onto the wafer or sample, the printed surface of the wafer, die, substrate, or other target may then be exposed to UV light, to set or cure the UV-sensitive ink to form the desired conductive circuit pattern as a solid.

Figure 3D:
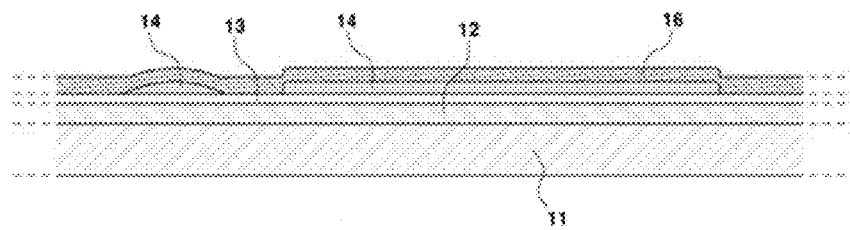

FIG. 3D is an illustration of an exemplary fourth step of the process of manufacturing an interposer, in accordance with an embodiment of the present disclosure. In the illustration of FIG. 3D, an insulating layer 16 is deposited over the conductive pattern layer 14 and the exposed portions of the passivation layer 13, to cover the conductive pattern layer 14 and the exposed portions of the passivation layer 13. In a preferred embodiment of the present disclosure, the insulating layer 16 covering the conductive pattern layer 14 may be formed by a spin coating method, although other methods of application of the insulating layer 16 to the conductive pattern layer 14 may be used. Because the insulating layer 16 may be uniformly deposited on the overall surface of both the conductive pattern layer 14 and the exposed portions of the passivation layer 13, the surface of the resulting coating of the insulating layer 16 may be uneven.

Figure 3E:
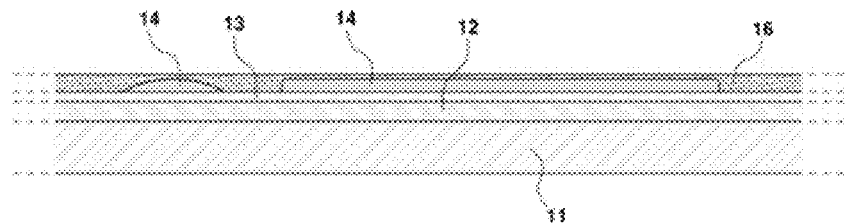

FIG. 3E is an illustration of an exemplary fifth step of the process of manufacturing an interposer, in accordance with an embodiment of the present disclosure. As illustrated in FIG. 3E, a flattening process may be performed using one or both of, by way of example and not limitation, a chemical process and/or a mechanical process, to flatten the insulating layer 16. The flattening of the insulating layer 16 may be performed to facilitate one or both of a process of exposing a portion of the conductive pattern layer 14 and a process of attaching two or more semiconductor dies in parallel, as further described below.

Figure 3F:
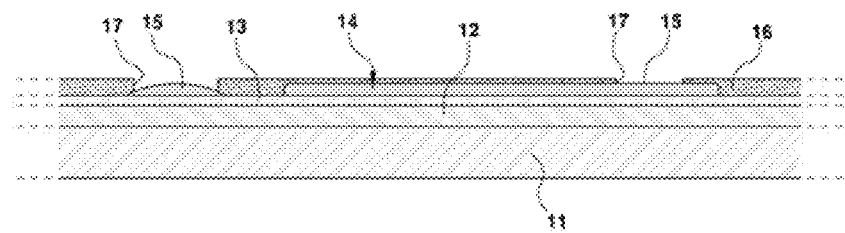

FIG. 3F is an illustration of an exemplary sixth step of the process of manufacturing an interposer, in accordance with an embodiment of the present disclosure. As shown in FIG. 3F, one or more vias 17 may be formed in one or more portions of the insulating layer 16 to expose one or more portions of the conductive pattern layer 14, illustrated in the example of FIG. 3F as connection pads 15. In one example embodiment of the present disclosure, desired regions of the insulating layer 16 may be completely removed using, for example, a laser, to form one or more through-holes in the insulating layer 16 through which a portion of the conductive pattern layer 14, serving as one or more connection pads, are exposed externally.

In a representative embodiment of the present disclosure, once the desired portion(s) of the insulating layer 16 have been removed to form opening(s) such as the vias 17, and the portion(s) of the conductive pattern layer 14 have been exposed as at connection pads 15 through the vias 17, an additional conductive pattern layer such as the conductive pattern layer 14, may be formed on the insulating layer 16 by one of the direct printing techniques described above. In this manner, the additional conductive pattern layer 14 may be conductively inter-connected to the connection pads 15. The process steps described above with respect to FIG. 3C through FIG. 3F of forming a conductive pattern layer 14, depositing an insulating layer 16 on the conductive pattern layer 14, flattening the insulating layer 16, and forming one or more vias 17 in one or more portions of the insulating layer 16 may be repeated two or more times, to form an interposer in which a plurality of the conductive pattern layers 14 are conductively stacked, with insulating layers positioned between the stacked conductive pattern layers, according to the first embodiment of the present disclosure.

Figure 4:
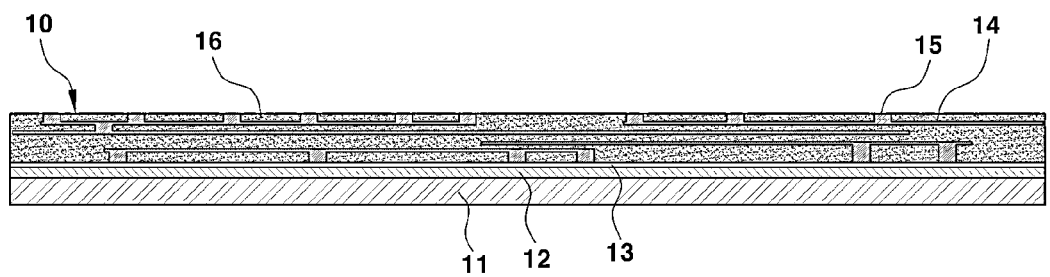
FIG. 4 is a cross-sectional view of an exemplary interposer manufactured atop the release layer of the carrier, according to the method illustrated in FIGS. 3A-3F and discussed above, in accordance with an embodiment of the present disclosure.

FIG. 4 is a cross-sectional view of an exemplary interposer 10 manufactured atop the release layer 12 of the carrier 11, according to the method illustrated in FIGS.

3A-3F and discussed above, in accordance with an embodiment of the present disclosure.

Having a structure in which a plurality of the conductive pattern layers 14 are stacked, with insulating layers positioned between the stacked conductive pattern layers, an interposer according to the first embodiment of the present disclosure, such as the exemplary interposer 10 of FIG. 4, can be designed to provide an electrical signal path in a desired direction, and can be thick enough to be readily handled but thin enough to aid in meeting the trend towards semiconductor packages that are thinner, lighter, and smaller.

In a representative embodiment of the present disclosure, once a plurality of the conductive pattern layers 14 have been conductively stacked, with insulating layers 16 positioned between the stacked conductive pattern layers, the connection pads 15 of the lowermost and uppermost conductive pattern layers 14 may be exposed to the outside through the insulating layer 16 so as to become attachment places of the input/output terminals in a packaging process described later.

Manufactured by forming a release layer and a passivation layer, in that order, on a carrier (silicon or glass), and then repeating processes of directly printing a conductive pattern layer, depositing a blanket of an insulating layer on the resultant structure, flattening the insulating layer, and exposing a portion of the conductive pattern layer through the insulating layer, the resulting interposer according to the first embodiment of the present disclosure has a structure that is slimmer and lighter, compared to an interposer such as that shown in FIG. 2, and thus can be useful for fabricating a lighter, thinner, shorter, and smaller semiconductor package.

Further, the manufacture of the interposer according to the embodiment of the present disclosure does not require some of the processes used for other interposer arrangements, such as, by way of example and not limitation, a photolithographic process, thus reducing the number of individual processes involved and the cost of production of a semiconductor package.

FIGS. 5A-5F show cross-sectional views illustrating steps in an exemplary process of manufacturing an interposer for use in a semiconductor package, according to a second exemplary embodiment of the present disclosure. As can be seen in FIGS. 5A-5F, an interposer according to a second embodiment of the present disclosure is structurally different from that of the first embodiment, described above with respect to FIGS. 3A-3F, in that the support member does not include a passivation layer.

Figure 5A:
FIGS. 5A-5F show cross-sectional views illustrating steps in an exemplary process of manufacturing an interposer for use in a semiconductor package, according to a second exemplary embodiment of the present disclosure.

FIG. 5A is a cross-sectional view of a first step of an exemplary process of manufacturing an interposer, in accordance with a second embodiment of the present disclosure. In a second exemplary embodiment of the present disclosure, a carrier having a certain area, such as the carrier 11 of FIG. 5A, may be provided. The carrier 11 of FIG. 5A may, for example, have features similar to or the same as the carrier 11 of FIG. 3A, described above.

Figure 5B:
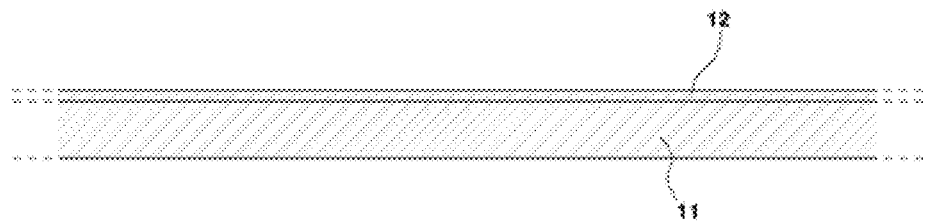

FIG. 5B is a cross-sectional view of a second step of an exemplary process of manufacturing an interposer, in accordance with a second embodiment of the present disclosure. In a second exemplary embodiment of the present disclosure, the carrier 11 of FIG. 5A may be coated with a release layer 12, which may have features similar to or the same as the release layer 12 of FIG. 3B, described above.

Figure 5C:
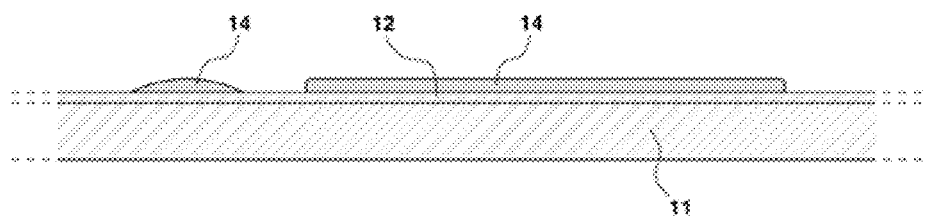

FIG. 5C is a cross-sectional view of a third step of an exemplary process of manufacturing an interposer, in accordance with a second embodiment of the present disclosure.

As shown in FIG. 5C, a conductive pattern layer 14 may be directly printed in a pattern conforming to a circuit design, directly onto the release layer 12. The conductive pattern layer 14 of FIG. 5C may have features similar to or the same as the conductive pattern layer 14 of FIG. 3C, described above. The direct printing of the conductive pattern layer 14 onto the release layer 12 may be performed using, by way of example and not limitation, nanoimprint lithography or inkjet printing technology, such as that described above with respect to FIG. 3C. In the representative embodiment shown in FIG. 5C, a passivation layer such as, for example, the passivation layer 13 of FIG. 3C, is not applied to the release layer 12 before direct printing of the first application of the conductive pattern 14.

Figure 5D:
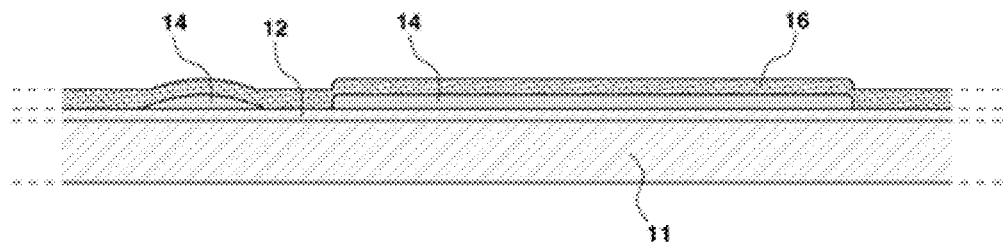

FIG. 5D is a cross-sectional view of a fourth step of an exemplary process of manufacturing an interposer, in accordance with a second embodiment of the present disclosure. In the illustration of FIG. 5D, as in the example embodiment of FIG. 3D, an insulating layer 16 is deposited over the conductive pattern layer 14 and the exposed portions of the release layer 12, to cover the conductive pattern layer 14 and the exposed portions of the release layer 12. The features of the insulating layer 16 of FIG. 5D may be similar to or the same as the insulating layer 16 of FIG. 3D.

Figure 5E:
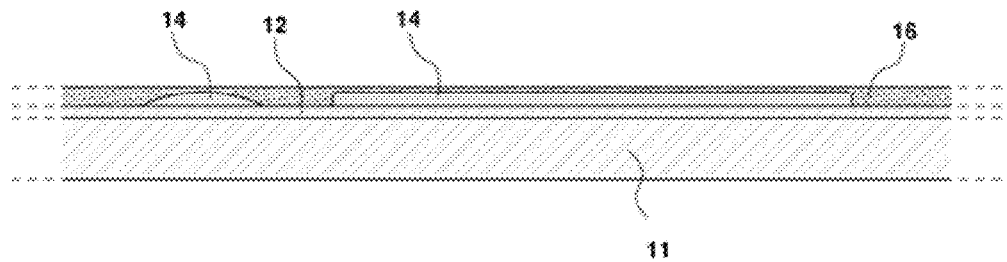

FIG. 5E is an illustration of an exemplary fifth step of the process of manufacturing an interposer, in accordance with a second embodiment of the present disclosure. As illustrated in FIG. 5E, a flattening process may be performed using one or both of, by way of example and not limitation, a chemical process and/or a mechanical process, to flatten the insulating layer 16, as further described above with respect to FIG. 3E.

Figure 5F:
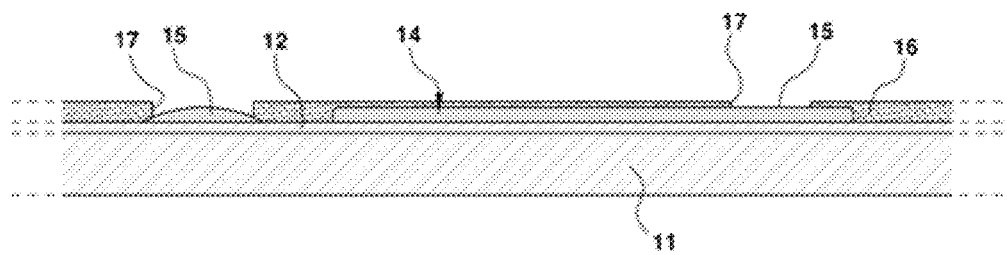

FIG. 5F is an illustration of an exemplary sixth step of the process of manufacturing an interposer, in accordance with a second embodiment of the present disclosure. As shown in FIG. 5F, one or more vias 17 may be formed in one or more portions of the insulating layer 16 to expose one or more portions of the conductive pattern layer 14, illustrated in the example of FIG. 5F as connection pads 15, as further described above with respect to FIG. 3F. In a representative embodiment according to the present disclosure, the operations described above with regard to FIGS. 5D, 5E, and 5F may be repeated to form a multilayer structure of conductive pattern layers and insulating layers onto the release layer 12 of the carrier 11.

Figure 6:
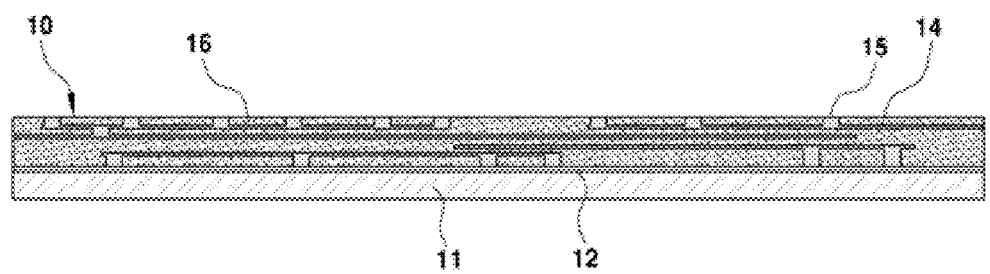
FIG. 6 is a cross-sectional view of an exemplary interposer manufactured atop the release layer of the carrier, according to the method illustrated in FIGS. 5A-5F and discussed above, in accordance with a second embodiment of the present disclosure.

FIG. 6 is a cross-sectional view of an exemplary interposer 10 manufactured atop the release layer 12 of the carrier 11, according to the method illustrated in FIGS. 5A-5F and discussed above, in accordance with a second embodiment of the present disclosure.

FIGS. 7A-7D show a series of cross-sectional views illustrating steps in a process of manufacturing a semiconductor package using an interposer that may correspond to, for example, the interposer 10 described above with regard to FIG. 3A through FIG. 3F, according to a first exemplary embodiment of the present disclosure. In FIGS. 7A-7D, reference numeral 10 denotes the interposer according to the first exemplary embodiment of the present disclosure.

Figure 7A:
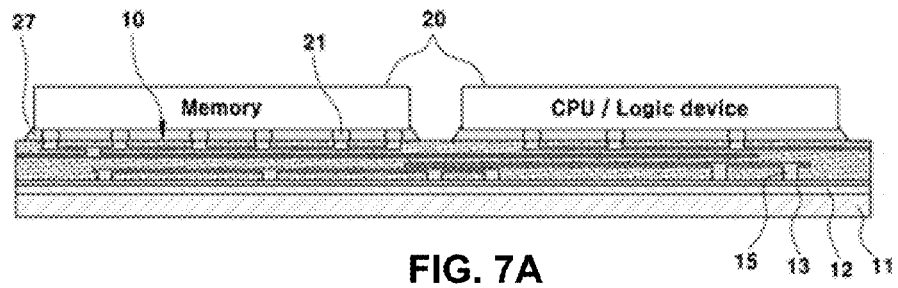
FIGS. 7A-7D show a series of cross-sectional views illustrating steps in a process of manufacturing a semiconductor package using an interposer that may correspond to, for example, the interposer described above with regard to FIG. 3A through FIG. 3F, according to a first exemplary embodiment of the present disclosure.
Figure 7B:
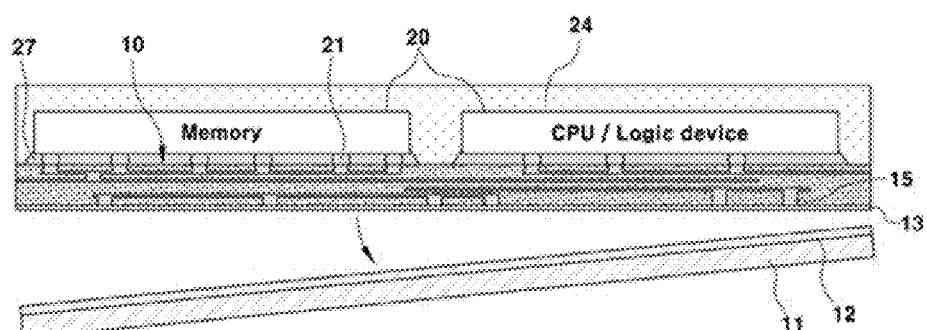

FIG. 7A is an illustration of an exemplary first step of the process of manufacturing a semiconductor package, in accordance with an embodiment of the present disclosure. As shown in FIG. 7A, two or more semiconductor die 20 such as, by way of example and not limitation, memory device die, logic device die, etc., may be conductively stacked on the top surface of the interposer 10 according to the foregoing first embodiment. To enable the attachment of the semiconductor die 20 to the interposer 10, a plurality of first input/output terminals 21 such as, for example, bumps or balls made of a solder material, or a flip die, may be fused to corresponding bonding pads of the semiconductor die 20 using, for example, a bumping process. The first input/output terminals 21 may then be fused to corresponding connection pads 15 of the interposer 10 using, for example, a welding or soldering operation to mount each of the semiconductor die 20 to the interposer 10. Any gap between the semiconductor die 20 and the interposer 10 may then be filled with an underfill material 27. The first input/output terminals 21 are thereby insulated from one another by the underfill material 27 while being surrounded and thus firmly fixed by the underfill material 27. Following the application of the underfill material 27, a molding compound resin 24 may be molded over the interposer 10 and the semiconductor die 20, to encapsulate and protect the semiconductor die 20 from the possible effects of the outside environment, as shown in the exemplary second step of FIG. 7B. In addition, as shown in FIG. 7B, the carrier 11 and release layer 12 may be removed from the passivation layer 13 element of the interposer 10, for possible later reuse as a support member in the production of another interposer 10.

Figure 7C:
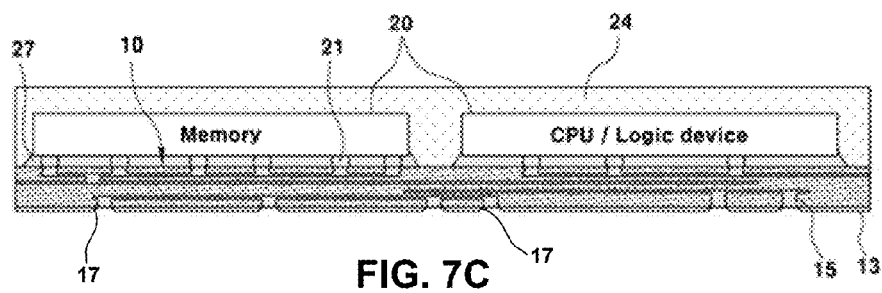

FIG. 7C is an illustration of an exemplary third step of the process of manufacturing a semiconductor package, in accordance with an embodiment of the present disclosure. In the illustration of FIG. 7C, a plurality of vias 17 may be formed through the passivation layer 13 to expose one or more connection pads 15 at the underside or lower surface of the interposer 10. Such vias 17 may be formed, for example, using a laser, a mechanical, and/or a chemical process.

Figure 7D:
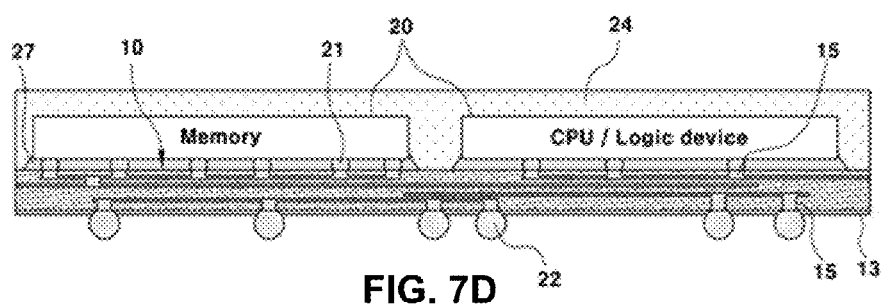

FIG. 7D is an illustration of an exemplary fourth step of the process of manufacturing a semiconductor package, in accordance with an embodiment of the present disclosure. As shown in FIG. 7D, the second input/output terminals 22 that may comprise, by way of example and not limitation, a bump or ball comprising a solder material, may be fused to the connection pad 15 exposed through the via 17 on the undersurface of the interposer 17 using, for example, a welding or soldering operation. A semiconductor package according to the first embodiment of the present disclosure is thus fabricated in this manner.

During the fabrication of some conventional semiconductor packages, a carrier similar to the carrier 11 (e.g., silicon or glass) may be removed from a semiconductor package by a back-grinding or etching process until a conductive pattern layer of the semiconductor package is exposed. In such an approach, the carrier is destroyed and cannot be reused, adding to the cost of manufacturing each semiconductor package. In contrast, a carrier according a representative embodiment of the present disclosure, such as the carrier 11 of FIGS. 7A-7D, may be detached from the interposer alone or together with the release layer 12, and can therefore be reused in the production of another interposer. In some representative embodiments of the present disclosure, a passivation layer such as passivation layer 13 may, for example, be allowed to remain as a protective layer.

In a representative embodiment of the present disclosure, the adhesive strength of the bond between the release layer 12 and the passivation layer 13 may be decreased by use of, for example, UV light, laser, or other thermal means, to permit detaching the carrier 11 and the release layer 12 from the passivation layer 13. Portions of the passivation layer 13 may then be selectively removed by, for example, a laser or photoresist technique to expose only the connection pad 15, and the carrier 11 may then be recycled after being removed together with the release layer 12.

Figure 8A:
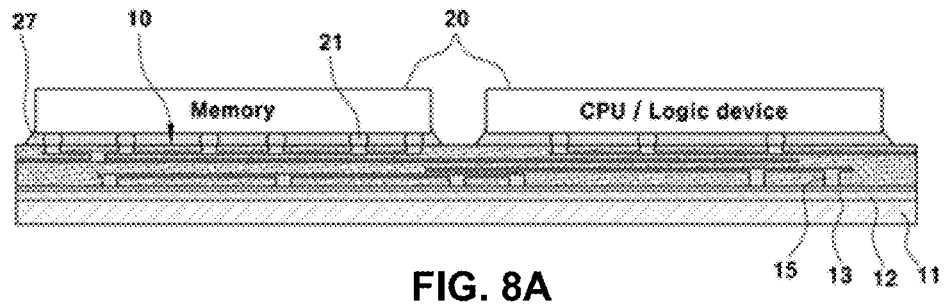
FIGS. 8A-8D show a series of cross-sectional views illustrating steps in a process of manufacturing a semiconductor package using an interposer such as the interposer described above with regard to FIG. 3A through FIG. 3F, according to another exemplary embodiment of the present disclosure.
Figure 8B:
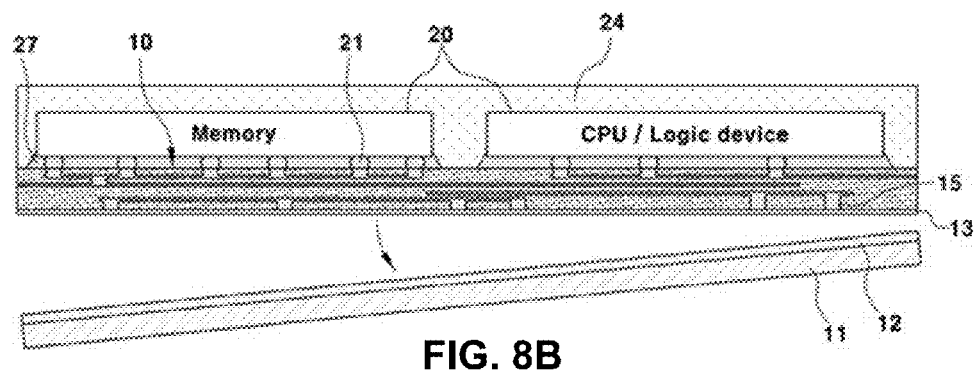
Figure 8C:
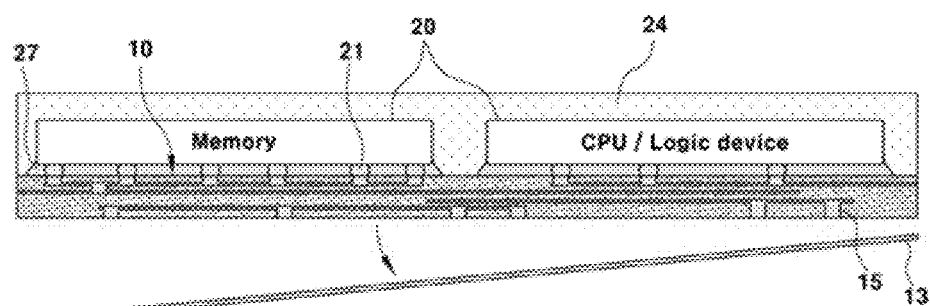
Figure 8D:
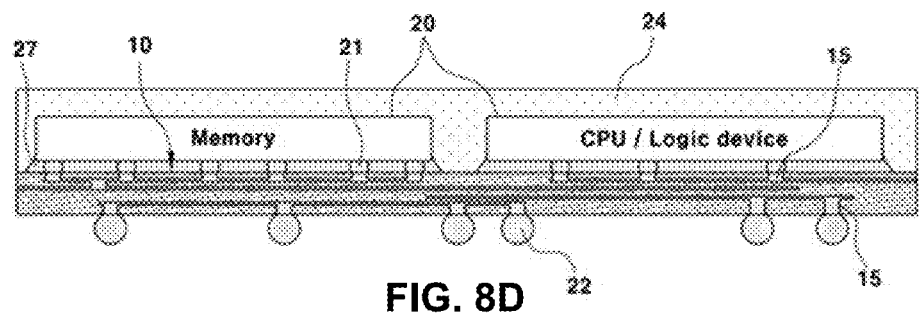

FIGS. 8A-8D show a series of cross-sectional views illustrating steps in a process of manufacturing a semiconductor package using an interposer such as the interposer 10 described above with regard to FIG. 3A through FIG. 3F, according to another exemplary embodiment of the present disclosure. In FIG. 8A-8D, reference numeral 10 denotes the interposer according to the first embodiment of the present disclosure. The semiconductor package of FIG. 8A according to the present disclosure may be fabricated in a manner similar to that described above with respect to the semiconductor package of FIG. 7A. However, in the example process of fabricating a semiconductor package as shown in FIGS. 8B-8D, in contrast to the process illustrated in FIGS. 7B-7D, the passivation layer 13 may be removed when the carrier 11 is detached from the interposer 10.

FIG. 8A is an illustration of an exemplary first step of the process of manufacturing a semiconductor package, in accordance with an embodiment of the present disclosure. As mentioned above, the structure of the semiconductor package of FIG. 8A may correspond to the structure of the semiconductor package of FIG. 7A, described above. As shown in FIG. 8B, the carrier 11 and the release layer 12 elements may be removed by applying heat to the release layer 12 on the carrier 11 using, for example, UV light, a laser, or a thermal means to decrease the strength of the adhesive bond of the release layer 12 to the passivation layer 13, to permit detaching the carrier 11 and the release layer 12 from the passivation layer 13, in the manner described above with the respect to FIG. 7B. Then, in an exemplary third step illustrated in FIG. 8C, the passivation layer 13 may be removed using, for example, a process involving photoresist and etching operations. The carrier 11 and release layer 12, shown in FIG. 8B following removal from the semiconductor package, may then be reused in the production of another interposer. FIG. 8D is an illustration of an exemplary fourth step of the process of manufacturing a semiconductor package, in accordance with an embodiment of the present disclosure. As shown in FIG. 8D, a plurality of second input/output terminals 22 that may be, for example, bumps or balls made of a solder material, may be welded or soldered to corresponding exposed portions of a conductive layer 14 at connection pads 15.

Figure 9A:
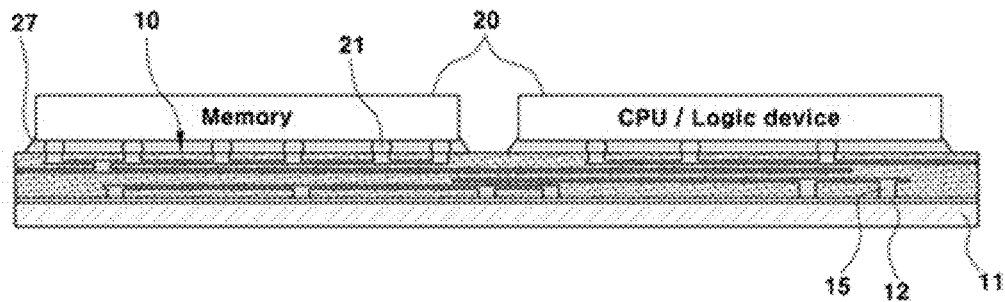
FIGS. 9A-9C show a series of cross-sectional views illustrating steps in a process of manufacturing a semiconductor package using an interposer such as the interposer described above with regard to FIG. 5A through 5F, according to yet another exemplary embodiment of the present disclosure.
Figure 9B:
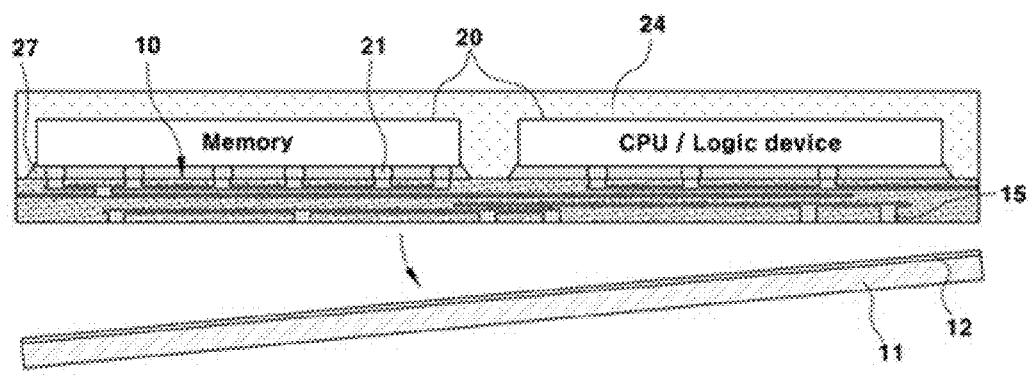
Figure 9C:
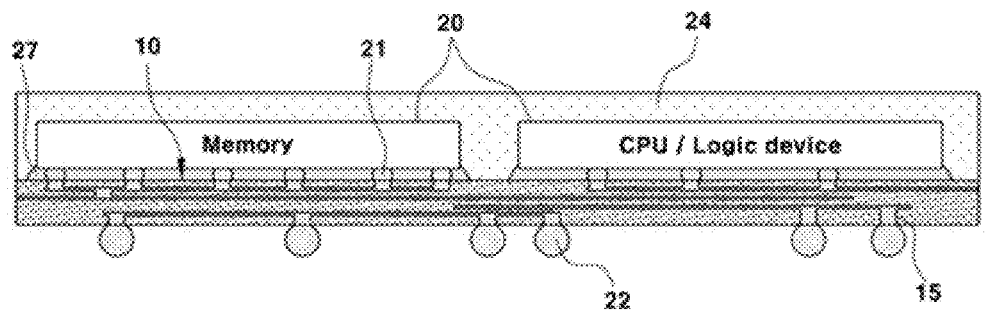

FIGS. 9A-9C show a series of cross-sectional views illustrating steps in a process of manufacturing a semiconductor package using an interposer such as the interposer 10, according to yet another exemplary embodiment of the present disclosure. In FIGS. 9A-9C, reference numeral 10 denotes an interposer according to the second embodiment of the present disclosure, as shown in FIGS. 5A-5F.

FIG. 9A shows an example semiconductor package using an interposer fabricated using the process shown in FIGS. 5A-5F. As illustrated in FIG. 9A, the interposer 10 used in the semiconductor package is fabricated without a passivation layer such as the passivation layer 13 shown in the interposer structure of FIGS. 3B-3F and FIG. 4. In an interposer according to the second embodiment of the present disclosure, the interposer structure is fabricated directly upon the release layer 12, which is located directly on the carrier 11, without use of a passivation layer such as the passivation layer 13 described above. In a representative embodiment of the present disclosure, the release layer 12 may be detached from the interposer 10 upon the removal of the carrier 11 from the semiconductor package. In this way, connection pads such as, for example, the connection pads 15 on the lower surface/underside/undersurface of the interposer 10 of FIGS. 9A-9C may be immediately exposed, so that the connection pads 15 may be fused with the second input/output terminals 22 (e.g., bumps or balls comprising, for example, a solder material), without the need to form vias in a passivation layer, thereby reducing the cost of manufacturing the semiconductor package.

In a representative embodiment of the present disclosure, as in the example of FIGS. 9A-9C, heat may be applied to the release layer 12 on the carrier 11 by use of, for example, UV light, a laser, or other thermal means, to decrease the adhesive strength of the bond between the release layer 12 and the lower surface of the interposer 10. The carrier 11 and release layer 12 may then be detached from the interposer to expose the connection pads 15 at the lower surface/underside/undersurface of the interposer. A plurality of second input/output terminals 22 such as, for example, bumps or balls of, for example, a solder material may then be welded or soldered to corresponding ones of the connection pads 15. In this arrangement, the carrier 11 may be reused, after being removed together with the release layer 12.

Figure 10:
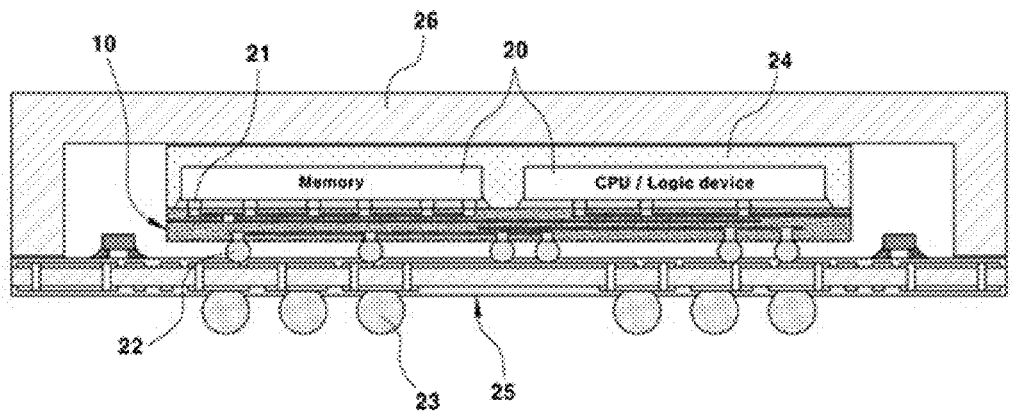
FIG. 10 is a cross-sectional view illustrating an exemplary semiconductor package according to a representative embodiment of the present disclosure.

FIG. 10 is a cross-sectional view illustrating an exemplary semiconductor package according to a representative embodiment of the present disclosure. In the illustration of FIG. 10, the reference numeral 10 denotes an interposer according to the first or second embodiments, described above.

The example semiconductor package of FIG. 10 is characterized by the surface mounting of a semiconductor package such as one of the examples of shown above, and includes a conformal shield or heat spreader 26. As shown in FIG. 10, the plurality of second input/output terminals 22 fused to the lower surface/undersurface/underside of the interposer 10 may be conductively bonded to a corresponding conductive pattern portion of a printed circuit board 25 using, for example, a welding or soldering operation, to mount the semiconductor package onto the PCB 25. In addition, a plurality of third input/output terminals 23 that may comprise, for example, a bump or ball of a solder material, may be welded or soldered to a "land" (e.g., a "ball land") formed on the lower or undersurface of the PCB 25.

In the example of FIG. 10, a conformal shield or heat spreader 26 is arranged in contact with or close proximity to the top surface of the molding compound resin 24 that encapsulates the semiconductor die 20. As shown in the example of FIG. 10, the lower edge or brim of the conformal shield or heat spreader 26 may also be attached to the PCB 25. A conformal shield or a heat spreader, such as the example conformal shield or heat spreader 26, may be configured to shield electromagnetic waves or to dissipate heat from one or more semiconductor die of a semiconductor package according to the present disclosure. Some embodiments of such a conformal shield or heat spreader may include an upper plate and a plurality of legs, which may be of constant thickness. A conformal shield or heat spreader in accordance with the present disclosure may be fabricated such that the upper interior surface of the conformal shield or heat spreader is in contact with or positioned closely to the top surface of a molding material (e.g., molding compound resin 24) used to encapsulate the one or more semiconductor die 20 of the semiconductor package, while legs of the conformal shield or heat spreader may be attached to the PCB 25 along the edge or brim of the conformal shield or heat spreader.

Figure 11:
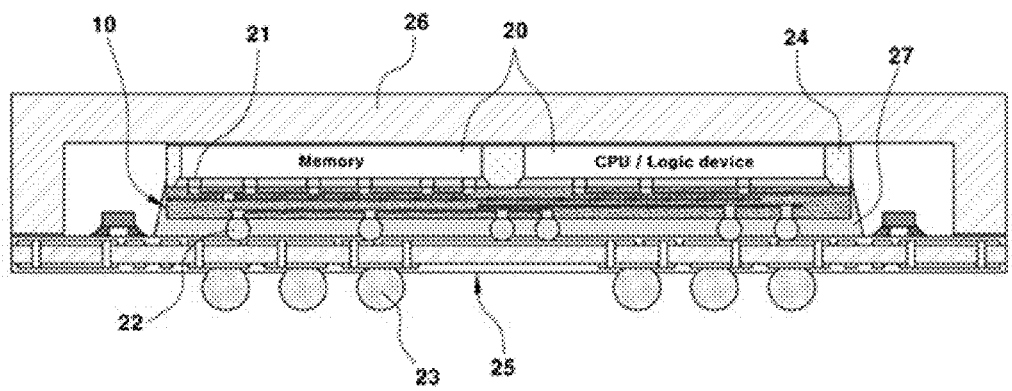
FIG. 11 is a cross-sectional view of an example semiconductor package according to yet another representative embodiment of the present disclosure.

FIG. 11 is a cross-sectional view of an example semiconductor package according to yet another representative embodiment of the present disclosure. The semiconductor package illustrated in FIG. 11 is substantially the same as the example semiconductor package of FIG. 10, with the exception that the top surfaces of the semiconductor die 20 are exposed by the molding compound resin 24 that encapsulates them, to aid in the dissipation of heat from the semiconductor die 20 via the conformal shield or heat spreader 26. In addition, in the example of FIG. 11, the plurality of second input/output terminals 22 electrically interconnecting the interposer 10 with the PCB 25 are encapsulated in an electrically insulating underfill material 27.

As can be seen in the example of FIG. 11, the top surface of the molding compound resin 24 used to encapsulate the semiconductor die 20 may be coplanar with the top surfaces of the semiconductor die 20, exposing the top surfaces of the semiconductor die 20. This may result, for example, from the method of performing the encapsulation of the semiconductor die 20, or from the use of mechanical abrasion to remove any of the molding compound resin 24 from the top surfaces of the semiconductor die 20, to expose the top surfaces of the semiconductor die 20. In a representative embodiment of the present disclosure, an electromagnetic wave-shielding conformal shield or a heat spreader 26 may then be applied in close or direct contact with the top surfaces of the semiconductor die 20, thereby maximizing heat dissipation. Further, any gap between the interposer 10 and the PCB 25 may be filled with an underfill material 27, to electrically insulate and fix the second input/output terminals 22 and the PCB 25.

FIGS. 12A-12E are cross-sectional views illustrating a series of process steps for manufacturing an example semiconductor package using an interposer such as those fabricated as described above with respect to FIGS. 3A-3F, according to still another representative embodiment of the present disclosure.

The semiconductor package according to the example of FIGS. 12A-12E is characterized by the construction of an interposer, having a structure as described above with regard to the first or second embodiments, but in which the interposer is fabricated directly on one or more semiconductor die using one of the direct printing techniques described above.

Figure 12A:
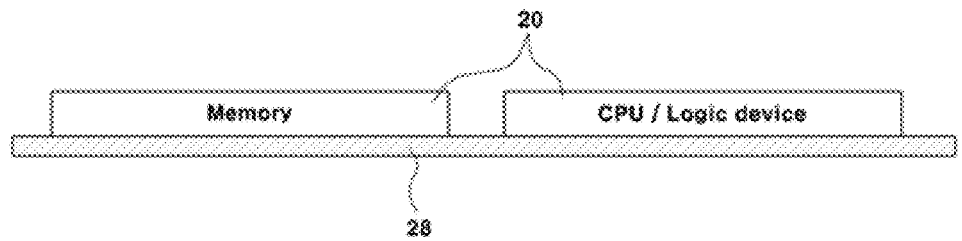
FIGS. 12A-12E are cross-sectional views illustrating a series of process steps for manufacturing an example semiconductor package using an interposer such as those fabricated as described above with respect to FIGS. 3A-3F, according to still another representative embodiment of the present disclosure.

FIG. 12A is a cross-sectional view of an exemplary first step in the process of fabricating a semiconductor package, in accordance with a representative embodiment of the present disclosure. As shown in FIG. 12A, in this step of the process, a face of each of two or more semiconductor die 20 may be positioned on a generally planar surface of a material in the form of a film comprising an adhesive such as, for example, the adhesive tape 28. The two or more semiconductor die 20 may be positioned in a spaced relation having a certain separation. The bonding properties of the adhesive may permit the attachment of the two or more semiconductor die to, and the removal of the two or more semiconductor die 20 from the adhesive tape 28 without damage to the semiconductor die 20. It should be noted that the adhesive tape 28 may form an occlusive seal with the surface of the semiconductor die 20 to which the adhesive tape is attached, to block incursion or flow of any materials upon the faces of the semiconductor die 20 which are positioned on the adhesive tape 28.

Figure 12B:
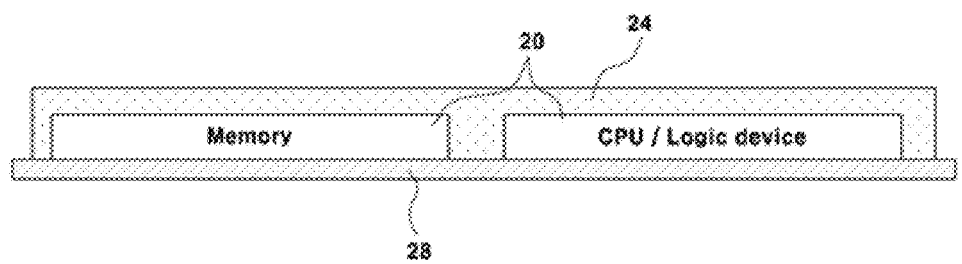

FIG. 12B is a cross-sectional view of an exemplary second step in the process of fabricating a semiconductor package, in accordance with a representative embodiment of the present disclosure. As shown in FIG. 12B, following the positioning of the semiconductor die 20 on the adhesive tape 28 as in FIG. 12A, a molding compound resin 24 may be applied over the semiconductor die 20 and the adhesive tape 28, to encapsulate the semiconductor die 20. The occlusive seal of the adhesive tape 28 with the lower/bottom surface of the semiconductor die 20 may act to block any flow of the molding compound resin 24 onto the lower/bottom surface of the semiconductor die 20.

Figure 12C:
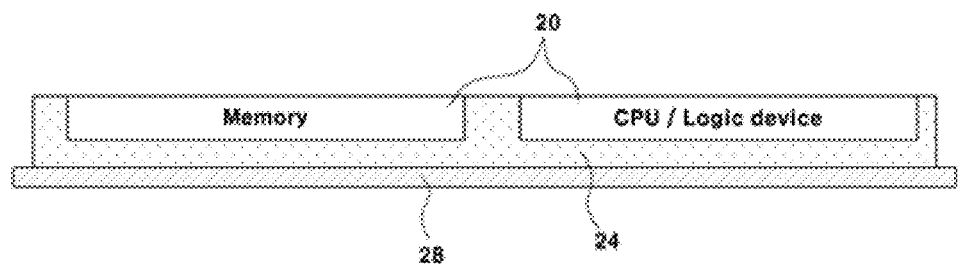

FIG. 12C is a cross-sectional view of an exemplary third step in the process of fabricating a semiconductor package, in accordance with a representative embodiment of the present disclosure. Following encapsulation of the semiconductor die 20 as shown in the example of FIG. 12B, the encapsulated semiconductor die 20 may be detached from the adhesive tape 28 and flipped over, to position the encapsulated semiconductor die 20 so that the surface of each semiconductor die 20 previously attached to the adhesive tape 28 is positioned away from the adhesive tape 28. The encapsulant-covered surface opposite the surface of each of the semiconductor die 20 previously attached to the adhesive tape 28 may then be attached to the adhesive tape 28. The process of overturning the encapsulated semiconductor die 20 directs the exposed surface of the semiconductor die 20 upwards, away from the adhesive tape 28, and attaches the upper surface of the molding compound resin 24 of the encapsulated semiconductor die 20, as in FIG. 12B, to the adhesive tape 28. It should be noted that the adhesive tape 28 to which the semiconductor die 20 are initially attached in FIG. 12A, and the adhesive tape 28 to which the encapsulated surface of the semiconductor die 20 are attached after being flipped, as in FIG. 12C, may be the same or different adhesive tapes 28.

Figure 12D:
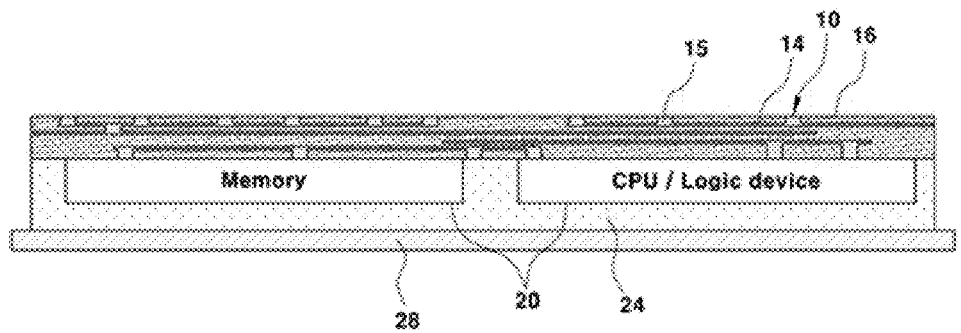

FIG. 12D is a cross-section view of an exemplary fourth step in the process of fabricating a semiconductor package, in accordance with a representative embodiment of the present disclosure. As shown in the illustration of FIG. 12D, an interposer 10 having a structure such as that described above with regard to the first and second embodiments may be fabricated, using the direct printing techniques described above, without use of a carrier 11 or release layer 12, on the flat plane of the exposed surfaces of the semiconductor die 20 and the surface of the molding compound resin 24 formed by the adhesive tape 28, as illustrated in FIG. 12B.

In a representative embodiment of the present disclosure, an interposer such as the interposer 10 of FIG. 12D may be directly formed on the surface of one or more semiconductor die 20 and molding compound encapsulating the semiconductor die 20, such as the molding compound resin 24 of FIGS. 12B-12D, by repeating a series of steps of a process of directly printing the elements of the interposer, such as that described above with regard to the examples of FIGS. 3A-3F, FIG. 4, FIGS. 5A-5F and FIG. 6. Such an approach may deposit one or more instances of an electrically conductive pattern layer 14 connected with bonding pads of the semiconductor die 20, where each such conductive layer 14 may be separated from others of the conductive layers 14 by an instance of an insulating layer 16, so as to encapsulate the conductive pattern layers 14. The approach may also include forming a plurality of vias 17 in corresponding portions of one or more of the insulating layers 16 such that corresponding regions of the conductive pattern layer 14 are exposed to connection pads 15, or to interconnection with portions of others of the conductive pattern layers 14.

Figure 12E:
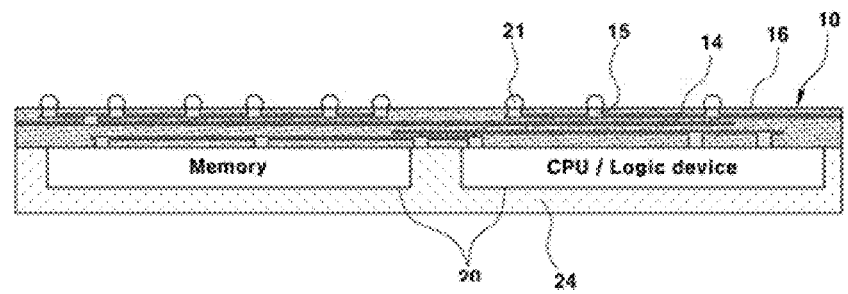

FIG. 12E is a cross-section view of an exemplary fifth step in the process of fabricating a semiconductor package, in accordance with a representative embodiment of the present disclosure. As illustrated in FIG. 12E, after the interposer 10 has been fabricated and the adhesive tape 28 has been detached from the semiconductor package of FIG. 12D, a plurality of first input/output terminals 21 may be fused to corresponding connection pads 15 of the interposer 10 using, by way of example and not limitation, a welding or soldering operation. The first input/output terminals 21 may, for example, be a bump or ball comprising a solder material. Through the exemplary process steps described with regard to FIGS. 12A-12E, a semiconductor package according to an additional embodiment of the present disclosure may be fabricated.

As such, the semiconductor packages according to the above example embodiments may be fabricated to be slimmer and lighter packages as they employ the light, slim, short, and small interposers of the present disclosure.

FIGS. 13A-13H are cross-sectional views illustrating the steps of a process for manufacturing an interposer, according to a third exemplary embodiment of the present disclosure.

Figure 13A:
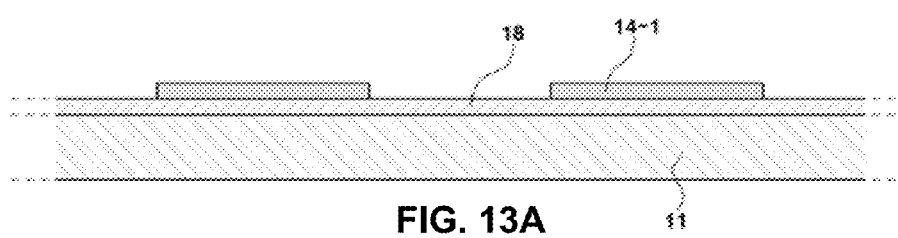
FIGS. 13A-13H are cross-sectional views illustrating the steps of a process for manufacturing an interposer, according to a third exemplary embodiment of the present disclosure.

FIG. 13A is a cross-sectional view of a first step of an exemplary process of manufacturing an interposer, in accordance with a third embodiment of the present disclosure. As shown in FIG. 13A, in the manufacture of an interposer 10 according to a third embodiment of the present disclosure, a metal carrier 11 may be coated with a suitable material to form an oxide layer 18 for preventing the oxidation of conductive pattern layers of the interposer 10. The formation of the oxide layer 18 may be followed by a process for forming on the oxide layer 18 a first conductive pattern layer 14-1 composed of a metal material in compliance with a desired circuit design, using a printing technique such as, by way of example and not limitation, a nanoimprint lithography technique or an inkjet printing technique such as those described above, or another suitable direct printing technique.

Figure 13B:
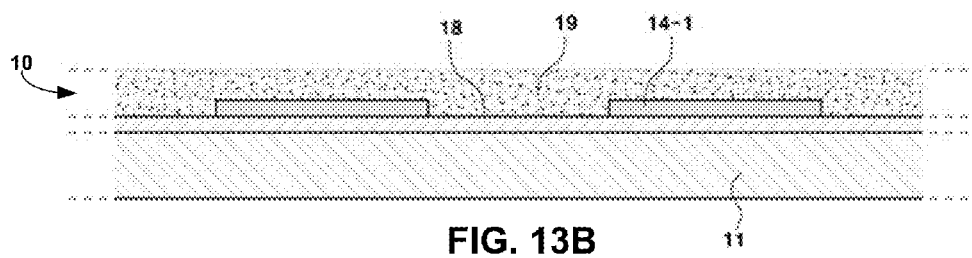

FIG. 13B is a cross-sectional view of a second step of an exemplary process of manufacturing an interposer, in accordance with a third embodiment of the present disclosure. As illustrated in FIG. 13B, the first conductive pattern layer 14-1 and any exposed portions of the oxide layer 18 may be covered with a blanket or layer of an insulating material 19, such as, for example, an insulating polymer, such that the first conductive pattern layer 14-1 and any exposed portions of the oxide layer 18 are encapsulated by the insulating material 19.

Figure 13C:
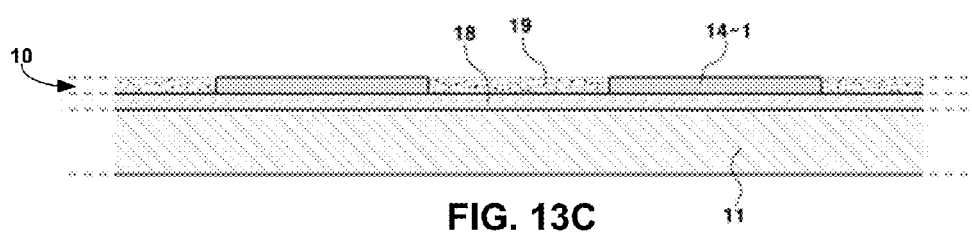

FIG. 13C is a cross-sectional view of a third step of an exemplary process of manufacturing an interposer, in accordance with a third embodiment of the present disclosure. As shown in FIG. 13C, the insulating material 19 may be subjected to, for example, a chemical and/or mechanical (CMP) polishing until one or more portions or regions of the first conductive pattern layer 14-1 are exposed. In this way, the resulting structure is flattened so that top surfaces of the insulating material 19 and the first conductive pattern layer 14-1 are co-planar or co-planar within a certain amount.

Figure 13D:
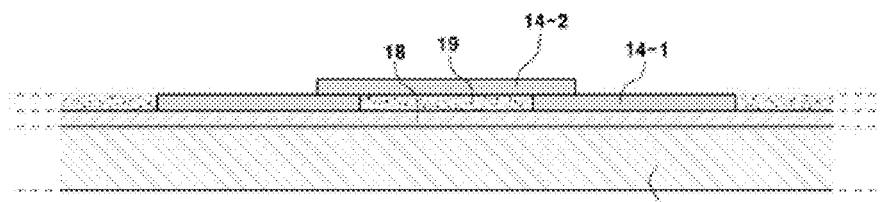

FIG. 13D is a cross-sectional view of a fourth step of an exemplary process of manufacturing an interposer, in accordance with a third embodiment of the present disclosure. As shown in the example of FIG. 13D, a second conductive pattern layer 14-2 may be deposited over the insulating material 19 and the first conductive pattern layer 14-1, in the same manner as in the formation of the first conductive pattern layer 14-1, so that the second conductive pattern layer 14-2 may be conductively inter-connected with the first conductive pattern layer 14-1.

Figure 13E:
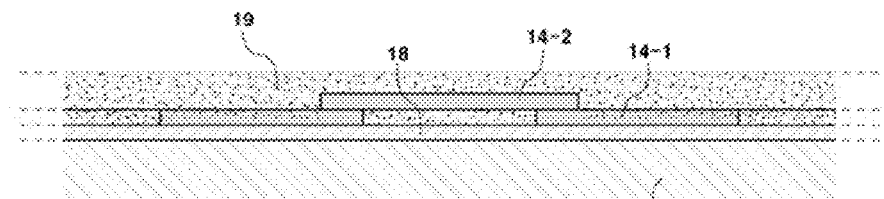

FIG. 13E is a cross-sectional view of a fifth step of an exemplary process of manufacturing an interposer, in accordance with a third embodiment of the present disclosure. In the example embodiment illustrated in FIG. 13E, the first and second conductive patterns 14-1 and 14-2 may be coated, and thus encapsulated with, an insulating material 19 that may again be, for example, an insulating polymer material.

Figure 13F:
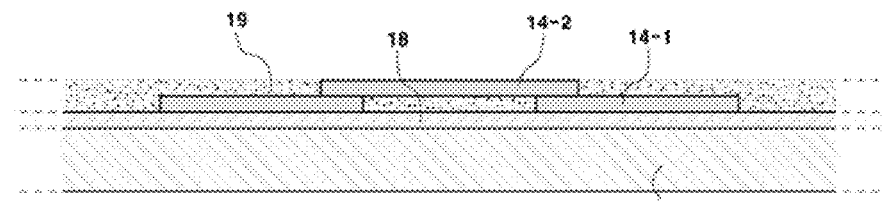

FIG. 13F is a cross-sectional view of a sixth step of an exemplary process of manufacturing an interposer, in accordance with a third embodiment of the present disclosure. As in the illustration of FIG. 13C, the insulating material 19 is subjected to chemical and/or mechanical polishing (CMP) process until one or more portions or regions of the top surface of the second conductive pattern layer 14-2 are exposed and the top surfaces of the insulating material 19 and the second conductive pattern layer 14-2 are co-planar or co-planar within a certain amount.

Figure 13G:
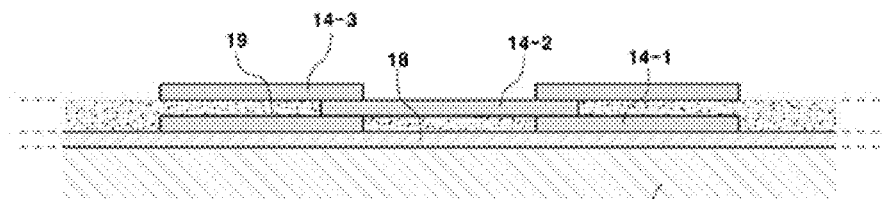

FIG. 13G is a cross-sectional view of a seventh step of an exemplary process of manufacturing an interposer, in accordance with a third embodiment of the present disclosure. As shown in FIG. 13G, a third conductive pattern layer 14-3 may be deposited over the insulating material 19 and the second conductive pattern layer 14-2, in the same manner as in the formation of the second conductive pattern layer 14-2, so that the third conductive pattern layer 14-3 may be conductively inter-connected with the exposed portions or regions of the second conductive pattern layer 14-2.

Figure 13H:
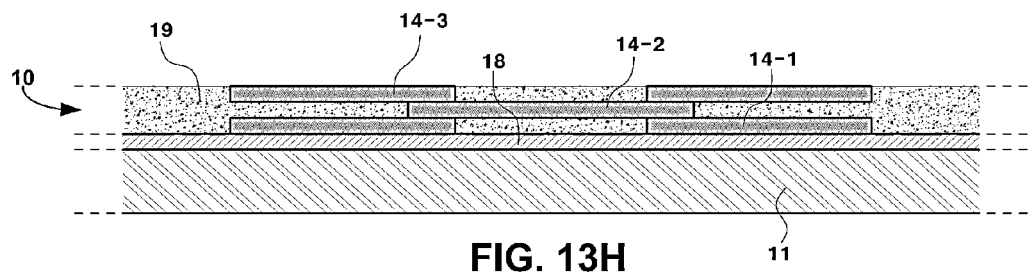

FIG. 13H shows an illustration of an eighth step of an exemplary process of manufacturing an interposer, in accordance with a third embodiment of the present disclosure. In the illustration of FIG. 13H, a blanket of an insulating material 19 (e.g., an insulating polymer) has been deposited over the third conductive pattern layer 14-3, as in FIG. 13B and FIG. 13E, and the surface of the insulating material 19 has been polished to expose one or more portions or regions of the top surface of the third conductive pattern layer 14-3, in the manner shown in and described above with regards to FIG. 13C and FIG. 13F.

Contrary to conventional complex redistribution layer (RDL) formation methods such as, for example, a plating process, the above process of repeating a series of processes of directly printing conductive pattern layers, coating the conductive pattern layers with an insulating material (e.g. an insulating polymer), and removing the insulating material by use of, for example, a chemical and/or mechanical process, can readily provide an interposer in which two, three, or more conductive patterns may be stacked.

The interposer according to the third embodiment of the present disclosure can be effectively manufactured in a much smaller number of processes and at significantly lower production cost, compared to an interposer using conventional techniques, because both a photolithographic process on silicon or glass, and an RDL process that involves a plating step, which are typically used for the manufacture of conventional interposers, are excluded.

FIGS. 13I-13M show a series of cross-sectional views illustrating steps in a process of manufacturing a semiconductor package using an interposer that may correspond to, for example, the interposer 10 described above with regard to FIGS. 13A-13H, according to another exemplary embodiment of the present disclosure.

Figure 13I:
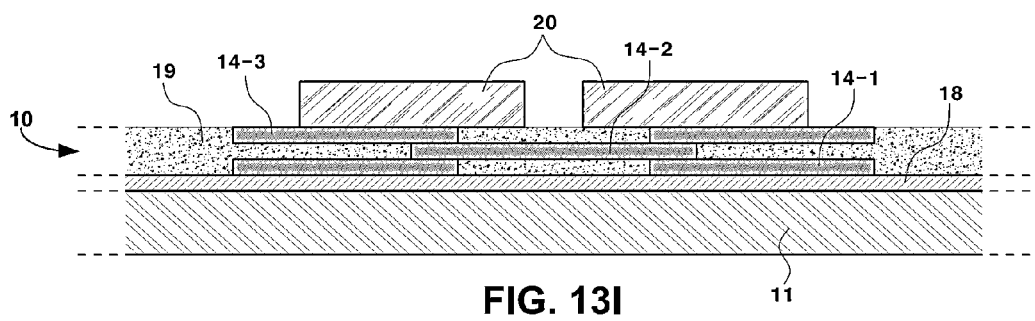
FIGS. 13I-13M show a series of cross-sectional views illustrating steps in a process of manufacturing a semiconductor package using an interposer that may correspond to, for example, the interposer described above with regard to FIGS. 13A-13H, according to another exemplary embodiment of the present disclosure.

FIG. 13I shows a first step in an exemplary process of manufacturing a semiconductor package using an interposer fabricated using the process described above and shown in FIGS. 13A-13H, according to a representative embodiment of the present disclosure. As shown in FIG. 13I, an interposer manufactured in accordance with the third embodiment of the present disclosure may be formed of one or more conductive pattern layers, in which insulating layers may be positioned between adjacent conductive pattern layers, in the manner described above. In the interposer example of FIG. 13I, three conductive pattern layers 14-1, 14-2, 14-3 are conductively stacked, with an insulating material 19 that may, for example, comprise a polymer material, positioned between the first, second, and third conductive pattern layers 14-1, 14-2, 14-3. In a representative embodiment of the present disclosure, one or more portions or regions of the insulating material 19 may be removed during fabrication of the interposer, to enable electrical interconnections of the conductive pattern layers 14-1, 14-2, 14-3 with one another, and to expose one or more portions or regions of the conductive pattern layers 14-1, 14-2, 14-3 to permit electrical connection to one or more semiconductor devices, such as the semiconductor devices 20 of FIG. 13I. As shown in the example of FIG. 13I, two semiconductor die 20 are conductively mounted on the top surface of the interposer 10, so that bonding pads of the semiconductor die 20 may be conductively inter-connected to corresponding portions or regions of the third conductive pattern layer 14-3. In a representative embodiment according to the present disclosure, bonding pads of the semiconductor die 20 may be conductively connected to the third conductive pattern layer 14-3 through, by way of example and not limitation, one or more conductive bumps or balls (not shown) that may comprise, for example, a solder material.

Figure 13J:
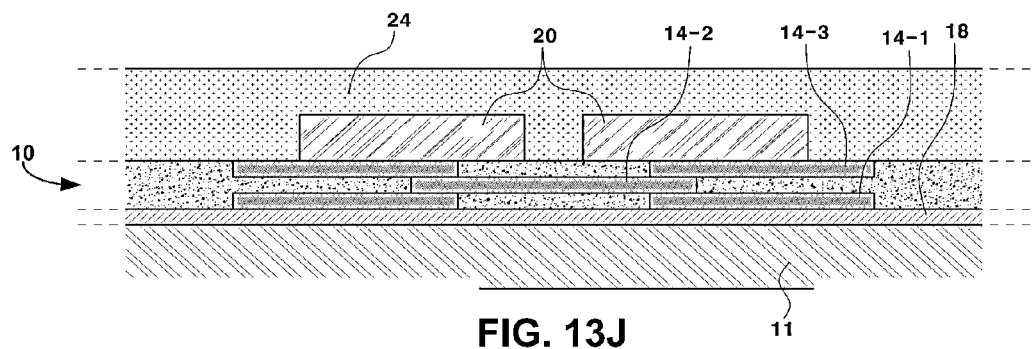

FIG. 13J shows a second step in an exemplary process of manufacturing a semiconductor package using an interposer fabricated using the process described above and shown in FIGS. 13A-13H, according to a representative embodiment of the present disclosure. As illustrated in FIG. 13J, a material such as a molding compound resin 24 may be molded over the interposer 10 to encapsulate and protect the semiconductor die 20 from the effects of an external environment (e.g., humidity, static discharge, physical damage, corrosion).

Figure 13K:
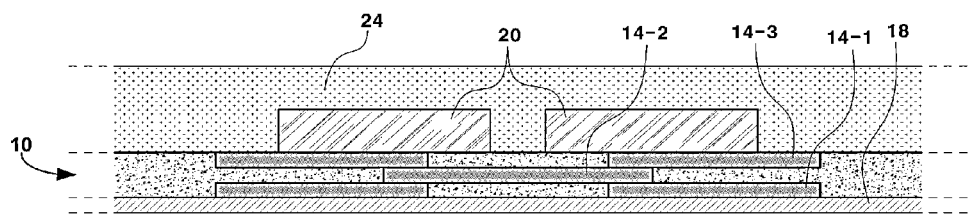

FIG. 13K illustrates a third step in an exemplary process of manufacturing a semiconductor package using an interposer fabricated using the process described above and shown in FIGS. 13A-13H, according to a representative embodiment of the present disclosure. In the illustration of FIG. 13K, the carrier 11 used to provide support during fabrication of the interposer 10 is removed.

Figure 13L:
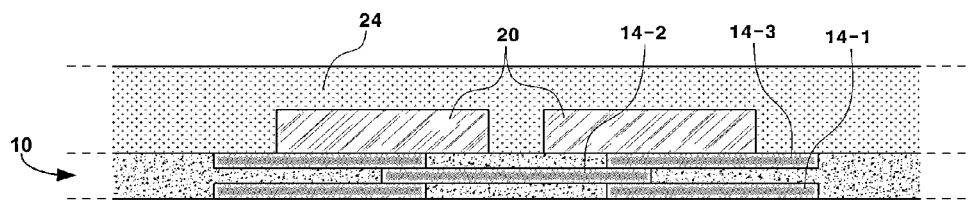

FIG. 13L illustrates a fourth step in an exemplary process of manufacturing a semiconductor package using an interposer fabricated using the process described above and shown in FIGS. 13A-13H, according to a representative embodiment of the present disclosure. In the illustration of FIG. 13L, the oxide layer 18 for preventing the oxidation of the conductive patterns is removed. As a result, one or more portions of the first conductive pattern layer 14-1, including portions that may serve, for example, as conductive "lands," may be exposed for the attachment of corresponding conductive members such as, by way of example and not limitation, one or more conductive bumps or balls of a solder material, thereby forming the undersurface of the interposer 10. In a representative embodiment according to the present disclosure, it may be preferable that the oxide layer 18 is only partially removed, so that only those portions of the first conductive pattern layer 14-1 that account for lands are exposed.

Figure 13M:
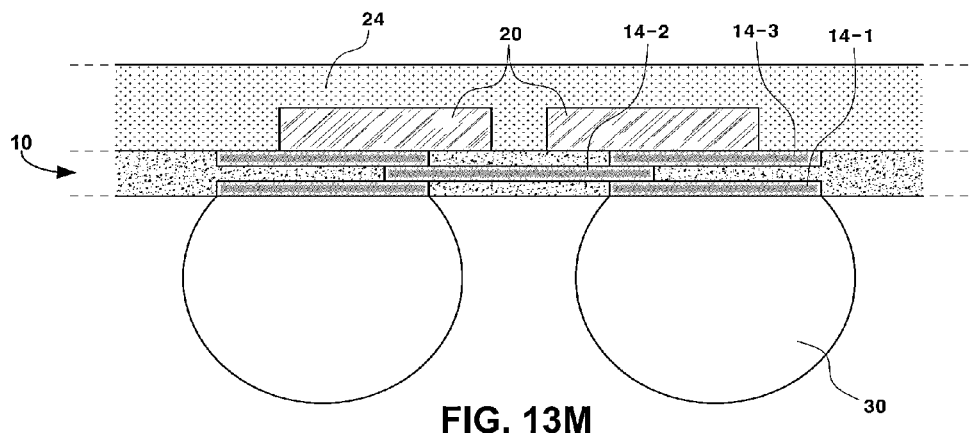

FIG. 13M illustrates a fifth step in an exemplary process of manufacturing a semiconductor package using an interposer fabricated using the process described above and shown in FIGS. 13A-13H, according to a representative embodiment of the present disclosure. As shown in the example of FIG. 13M, one or more solder balls 30 may be conductively attached to exposed portions of the first conductive pattern layer 14-1 that serve as a "land" portion using, for example, a welding or soldering operation, to complete the fabrication of the semiconductor package according to the example of FIGS. 13I-13M.

A representative embodiment according to the present disclosure can provide an interposer for manufacturing a semiconductor package in which a plurality of conductive pattern layers are inter-conductively stacked within a number of insulating layers. Fabrication of such an interposer may use a process that begins by sequentially coating a release layer and a passivation layer on a carrier (e.g., silicone or glass). The process then forms one or more conductive pattern layers on the passivation layer using a direct printing method, where each of the conductive pattern layers are coated by an insulating layer of a certain thickness. The process may include exposing one or more portions of each conductive pattern layers through corresponding portions of the insulating layers.

In a representative embodiment according to the present disclosure, the carrier and release layer may be removed, intact, from the interposer, which is configured to have a structure in which only the conductive pattern layers and the insulating layers are stacked. Such an interposer is not based on a typical use of silicon or glass material. Accordingly, through the use of an embodiment of the present disclosure, a thinner and lighter interposer can be provided, thereby allowing the interposer to be useful for the manufacture of lighter, thinner, shorter, and smaller semiconductor packages.

In a representative embodiment according to the present disclosure, processes such as photolithography processes and grinding processes, which may used for the manufacture of a conventional interposer, may be omitted, and the cost of those manufacturing process steps can be saved. In addition, a carrier for manufacturing the interposer may be re-used, rather than being destroyed during removal by back-grinding.

Because an interposer in accordance with the present disclosure is lighter, thinner, and smaller than interposers of the past, a semiconductor package may be manufactured using an interposer of the present disclosure, which permits an upper die and a PCB to be conductively connected in a lighter, thinner, shorter, and smaller semiconductor package.

Aspects of the present disclosure may be seen in a method of manufacturing an interposer for use in a semiconductor package. Such a method may comprise providing a support member having a generally planar surface of a certain area dimension on which to fabricate the interposer, fabricating the interposer, and removing the support member from the interposer. Fabricating the interposer may comprise forming a first electrically conductive pattern layer on the support member by applying a liquid on the surface of the support member using a direct printing technique, and applying an electrically insulating layer to cover the electrically conductive pattern layer. Fabricating the interposer may also comprise forming a second electrically conductive pattern layer on the surface of the electrically insulating layer by applying the liquid to selected portions of the surface of the electrically insulating layer using a direct printing technique.

In a method according to the present disclosure, the support member may comprise a re-usable carrier, and the re-usable carrier may comprise silicon or glass. In addition, the support member may comprise a release layer that permits separation of the support member from the interposer. The method may also comprise applying a passivation layer to the release layer of the support member, and wherein said forming a first electrically conductive pattern layer may comprise applying the liquid directly to selected portions of the passivation layer.

In a method according to the present disclosure, applying an insulating layer over the first conductive pattern layer may comprise applying an insulating material in direct contact with the first conductive pattern layer, and after applying the insulating material, removing one or more portions of the insulating material to expose one or more corresponding portions of the first conductive pattern layer. The insulating material may comprise an insulating polymer material. In a representative embodiment of the disclosure, the liquid may become an electrically conductive solid upon exposure to ultraviolet (UV) light, and the method may comprise exposing the liquid on the insulating layer to a source of UV light. In some representative embodiments of the disclosure, the liquid may become an electrically conductive solid upon evaporation of a solvent in the liquid, and the method may comprise causing evaporation of the solvent to solidify the liquid.

In a representative embodiment according to the present disclosure, the direct printing technique may comprise coating one or more surfaces of a tool with the liquid, where the coating on the one or more surfaces may be representative of one or more circuit paths, and transferring the liquid from the one or more coated surfaces of the tool by pressing the one or more coated surfaces of the tool against a corresponding one of the support member and the insulating layer. In some representative embodiments of the present disclosure, the direct printing technique may comprise spraying the liquid upon at least one of the support member and the insulating layer, to form one or more continuous paths of the liquid representative of one or more circuit paths. In some representative embodiment of the present disclosure, applying the electrically insulating layer may comprise flattening an exposed surface of the electrically insulating layer. Fabricating the interposer may comprise applying an additional electrically insulating layer to cover a previously formed electrically conductive pattern layer, and forming an additional electrically conductive pattern layer on the surface of the additional electrically insulating layer, by applying the liquid to selected portions of a surface of the additional electrically insulating layer using the direct printing technique. These operations may be performed one or more times, in the indicated order, after forming the second conductive pattern layer.

Additional aspects of the present disclosure may be observed in a method of manufacturing a semiconductor package comprising an interposer. Such a method may comprise providing a semiconductor device comprising two or more semiconductor die, where the semiconductor device may comprise a generally planar surface of a certain area dimension on which to fabricate the interposer. The generally planar surface of the semiconductor device may expose a face of each of the two or more semiconductor die. The method may also comprise fabricating the interposer on the generally planar surface of the semiconductor device by, at least in part, forming an electrically conductive pattern layer on the surface of and electrically interconnected to the semiconductor device by applying a liquid to selected portions of the generally planar surface of the semiconductor device using a direct printing technique, and applying an electrically insulating layer to cover the electrically conductive pattern layer.

In a representative embodiment of the present disclosure, providing the semiconductor device may comprise positioning a face of each of the two or more semiconductor die on a generally planar surface of a material film, in a spaced relation, the two or more semiconductor die separated by a certain distance, and encapsulating the two or more semiconductor die as a single unit, by applying a mold material over the two or more semiconductor die and the material film, to form the semiconductor device. Providing the semiconductor device may also comprise removing the semiconductor device from the material film to expose the generally planar surface of the semiconductor device comprising the faces of each of the two or more semiconductor die. The generally planar surface of the material film may comprise an adhesive having characteristics that enable attachment of the two or more semiconductor die to the material film and removal of the encapsulated two or more semiconductor die from the material film, without damage to the two or more semiconductor die. The direct printing technique may comprise spraying the liquid upon at least one of the semiconductor device and the insulating layer, to form one or more continuous paths of the liquid representative of one or more circuit paths, and exposing the liquid on the insulating layer to a source of ultraviolet (UV) light. The liquid may become an electrically conductive solid upon exposure to the UV light.

Further aspects of the present disclosure may be found in a method of manufacturing an interposer for use in a semiconductor package. Such a method may comprise providing a support member comprising a release layer having a generally planar surface of a certain area dimension on which to fabricate the interposer. The method may also comprise fabricating the interposer on the support member. The interposer may comprise an electrically interconnected multilayer structure comprising two or more electrically conductive pattern layers with intercalating electrically insulating layers, and the electrically conductive pattern layers may be formed using a direct printing technique. The method may further comprise removing the support member from the interposer without damage to the support member and without damage to the interposer. The direct printing technique may comprise spraying a liquid upon one or more of the support member and the insulating layers, to form one or more continuous paths of the liquid representative of one or more circuit paths, and exposing the liquid to a source of ultraviolet (UV) light. The liquid may become an electrically conductive solid upon exposure to the UV light. In a representative embodiment according to the present disclosure, each insulating layer may comprise an insulating material applied to a corresponding one of the conductive pattern layers, and one or more portions of the insulating material may be removed to expose one or more corresponding portions of the corresponding one of the conductive pattern layers.

The disclosure has described in detail various exemplary embodiments. However, it will be appreciated by those skilled in the art that changes may be made in these embodiments without departing from the principles and spirit of the disclosure, the scope of which is defined in the appended claims and their equivalents.

Although the preferred embodiments of the present disclosure have been provided for illustrative purposes, those skilled in the art will appreciate that various modifications, additions, and substitutions are possible, without departing from the scope and spirit of the disclosure, as recited in the accompanying claims.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method of manufacturing a semiconductor package comprising an interposer, the method comprising:
   providing a semiconductor device comprising two or more semiconductor die, the semiconductor device comprising a generally planar surface of a certain area dimension on which to fabricate the interposer, the generally planar surface of the semiconductor device exposing a face of each of the two or more semiconductor die; and
   fabricating the interposer on the generally planar surface of the semiconductor device by, at least in part:
      forming an electrically conductive pattern layer in direct contact with the surface of and electrically interconnected to the faces of one or both of the two or more semiconductor die exposed on the semiconductor device by applying a liquid having a particular curing process that causes the liquid to become an electrically conductive solid to selected portions of the generally planar surface of the semiconductor device using a direct printing technique, and
   applying an electrically insulating layer to cover the electrically conductive pattern layer;
   wherein the direct printing technique comprises:
      flattening the electrically insulating layer;
      spraying the liquid upon at least one of the semiconductor device and the electrically insulating layer, to form one or more continuous paths of the liquid representative of one or more circuit paths; and
      performing the particular curing process upon the liquid on at least one of the semiconductor device and the electrically insulating layer to cause the liquid to become the electrically conductive solid.

2. The method according to claim 1, wherein providing the semiconductor device comprises:
   positioning a face of each of the two or more semiconductor die on a generally planar surface of a material film, in a spaced relation, the two or more semiconductor die separated by a certain distance;
   encapsulating the two or more semiconductor die as a single unit, by applying a mold material over the two or more semiconductor die and the material film, to form the semiconductor device; and
   removing the semiconductor device from the material film to expose the generally planar surface of the semiconductor device comprising the faces of each of the two or more semiconductor die.

3. The method according to claim 2, wherein the generally planar surface of the material film comprises an adhesive having characteristics that enable attachment of the two or more semiconductor die to the material film and removal of the encapsulated two or more semiconductor die from the material film, without damage to the two or more semiconductor die.

4. The method according to claim 1, wherein the liquid is a material that becomes the electrically conductive solid upon exposure to ultraviolet (UV) light, and the particular curing process comprises exposing the liquid to UV light.

5. The method according to claim 1, further comprising
   forming another electrically conductive pattern layer in direct contact with the surface of the electrically insulating layer and portions of the electrically conductive pattern layer exposed by the electrically insulating layer by applying the liquid to selected portions of the electrically insulating layer and the electrically conductive pattern layer using the direct printing technique to electrically interconnect the other electrically conductive pattern layer to the electrically conductive pattern layer.

6. The method according to claim 5, wherein providing the semiconductor device comprises:
positioning a face of each of the two or more semiconductor die on a generally planar surface of a material film, in a spaced relation, the two or more semiconductor die separated by a certain distance;
encapsulating the two or more semiconductor die as a single unit, by applying a mold material over the two or more semiconductor die and the material film, to form the semiconductor device; and
removing the semiconductor device from the material film to expose the generally planar surface of the semiconductor device comprising the faces of each of the two or more semiconductor die.

7. The method according to claim 6, wherein the generally planar surface of the material film comprises an adhesive having characteristics that enable attachment of the two or more semiconductor die to the material film and removal of the encapsulated two or more semiconductor die from the material film, without damage to the two or more semiconductor die.

8. A method of manufacturing a semiconductor package comprising an interposer, the method comprising:
providing a semiconductor device comprising two or more semiconductor die, the semiconductor device comprising a generally planar surface of a certain area dimension on which to fabricate the interposer, the generally planar surface of the semiconductor device exposing a face of each of the two or more semiconductor die; and
fabricating the interposer on the generally planar surface of the semiconductor device by, at least in part:
forming an electrically conductive pattern layer in direct contact with the surface of and electrically interconnected to the faces of one or both of the two or more semiconductor die exposed on the semiconductor device by applying a liquid having a particular curing process that causes the liquid to become an electrically conductive solid to selected portions of the generally planar surface of the semiconductor device using a direct printing technique, and
applying an electrically insulating layer to cover the electrically conductive pattern layer;
wherein the direct printing technique comprises:
flattening the electrically insulating layer;
providing a tool comprising a surface on which is formed a pattern representative of one or more circuit paths;
coating the liquid upon the pattern on the surface of the tool to form one or more continuous paths of the liquid;
transferring the liquid from the pattern on the surface of the tool to a surface of at least one of the semiconductor device and the electrically insulating layer; and
performing the particular curing process upon the liquid on the surface of at least one of the semiconductor device and the electrically insulating layer to cause the liquid to become the electrically conductive solid.

9. The method according to claim 8, wherein the liquid is a material that becomes the electrically conductive solid upon exposure to ultraviolet (UV) light, and the particular curing process comprises exposing the liquid to UV light.

10. A method of manufacturing a semiconductor package comprising an interposer, the method comprising:
fabricating an interposer on a generally planar surface of a semiconductor device comprising two or more semiconductor die, the generally planar surface having a certain area dimension that exposes a face of each of the two or more semiconductor die, the fabricating comprising:
forming, in direct contact with the surface of and electrically interconnected to the faces of one or both of the two or more semiconductor die exposed on the semiconductor device, two or more electrically conductive pattern layers electrically interconnect via selected portions of one or more interleaving electrically insulating layers, wherein each electrically conductive pattern layer is formed using a direct printing technique that selectively applies a liquid to portions of the generally planar surface of the semiconductor device or one of the electrically insulating layers, the liquid forming a conductive solid when a particular curing process is applied;
wherein the direct printing technique comprises:
flattening one of the electrically insulating layers;
spraying the liquid upon the semiconductor device or the one of the electrically insulating layers, to form one or more continuous paths of the liquid representative of one or more circuit paths; and
performing the particular curing process upon the liquid on the semiconductor device or the one of the electrically insulating layers to cause the liquid to become an electrically conductive solid.

11. The method according to claim 10, wherein the semiconductor device comprises:
two or more semiconductor die encapsulated as a single unit, wherein the faces of each of the two or more semiconductor die exposed by the encapsulation are on a same generally planar surface of the semiconductor device in a spaced relation separated by a certain distance.

12. The method according to claim 10, wherein the liquid is a material that becomes the electrically conductive solid upon exposure to ultraviolet (UV) light, and the particular curing process comprises exposing the liquid to UV light.

* * * * *